(12) United States Patent
Park et al.

(10) Patent No.: US 8,779,576 B2
(45) Date of Patent: Jul. 15, 2014

(54) WAFER LEVEL PACKAGE AND METHODS OF FABRICATING THE SAME

(75) Inventors: Sang-wook Park, Hwaseong-si (KR); Nam-seog Kim, Yongin-si (KR); Seung-duk Baek, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 582 days.

(21) Appl. No.: 13/037,159

(22) Filed: Feb. 28, 2011

(65) Prior Publication Data

US 2011/0272819 A1 Nov. 10, 2011

(30) Foreign Application Priority Data

May 7, 2010 (KR) ........................ 10-2010-0043052

(51) Int. Cl.
*H01L 23/48* (2006.01)
*H01L 23/00* (2006.01)
*H01L 23/31* (2006.01)

(52) U.S. Cl.
CPC ....... *H01L 24/02* (2013.01); *H01L 2924/01005* (2013.01); *H01L 24/05* (2013.01); *H01L 2924/01033* (2013.01); *H01L 2224/05548* (2013.01); *H01L 2924/01006* (2013.01); *H01L 2224/13022* (2013.01); *H01L 2924/01047* (2013.01); *H01L 2224/0236* (2013.01); *H01L 2224/05012* (2013.01); *H01L 2924/01322* (2013.01); *H01L 23/3192* (2013.01); *H01L 2224/13021* (2013.01); *H01L 24/13* (2013.01); *H01L 2924/01082* (2013.01); *H01L 2924/014* (2013.01); *H01L 2224/024* (2013.01)
USPC ............ 257/692; 257/E23.068; 257/E21.294; 257/774; 438/613

(58) Field of Classification Search
USPC .................. 257/692, E23.068, E21.294, 774; 438/613
See application file for complete search history.

(56) References Cited

U.S. PATENT DOCUMENTS

| 6,548,897 | B2 | 4/2003 | Grigg | |
|---|---|---|---|---|
| 6,578,755 | B1 | 6/2003 | Elenius et al. | |
| 6,756,253 | B1 | 6/2004 | Farnworth et al. | |
| 7,126,164 | B2 | 10/2006 | Johnson et al. | |
| 7,888,409 | B2* | 2/2011 | Hayata et al. | 523/218 |
| 2003/0218250 | A1* | 11/2003 | Kung et al. | 257/737 |
| 2009/0096098 | A1 | 4/2009 | Yang et al. | |
| 2009/0288866 | A1* | 11/2009 | Tsai et al. | 174/260 |
| 2010/0187677 | A1* | 7/2010 | Lee | 257/692 |
| 2010/0289126 | A1* | 11/2010 | Pagaila et al. | 257/659 |
| 2011/0201194 | A1* | 8/2011 | Gruber et al. | 438/613 |

FOREIGN PATENT DOCUMENTS

| JP | 2002-299508 | 10/2002 |
|---|---|---|
| JP | 2007-123426 | 5/2007 |
| JP | 2008-159948 | 7/2008 |
| KR | 1020000015326 | 3/2000 |
| KR | 1020000040997 | 7/2000 |
| KR | 1020000043104 | 7/2000 |
| KR | 1020060016217 | 2/2006 |

* cited by examiner

*Primary Examiner* — S. V. Clark
*Assistant Examiner* — Krista Soderholm
(74) *Attorney, Agent, or Firm* — Renaissance IP Law Group LLP

(57) ABSTRACT

In one embodiment, a wafer level package includes a rerouting pattern formed on a semiconductor substrate and a first encapsulant pattern overlying the rerouting pattern. The first encapsulant pattern has a via hole to expose a portion of the rerouting pattern. The package additionally includes an external connection terminal formed on the exposed portion of the rerouting pattern. An upper section of the sidewall and a sidewall of the external connection terminal may be separated by a gap distance. The gap distance may increase toward an upper surface of the encapsulant pattern.

27 Claims, 23 Drawing Sheets

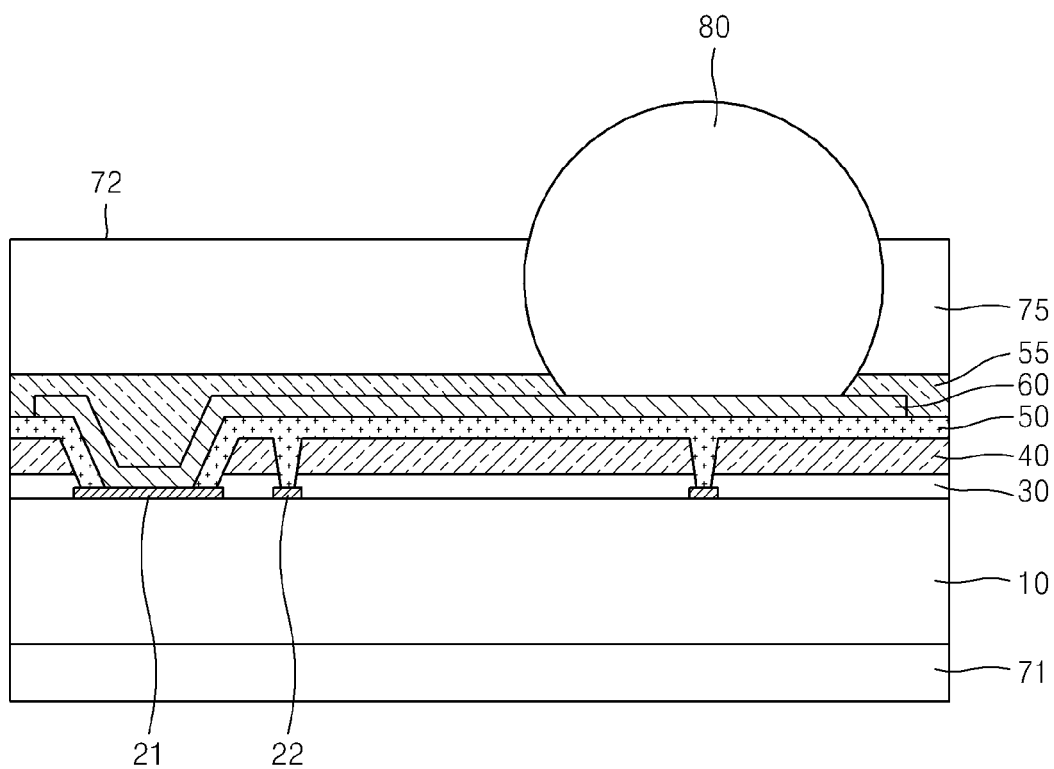

WAFER LEVEL PACKAGE AND METHODS OF FABRICATING THE SAME

CROSS-REFERENCE TO RELATED APPLICATIONS

This application claims the benefit of Korean Patent Application No. 10-2010-0043052, filed on May 7, 2010, in the Korean Intellectual Property Office, the disclosure of which is incorporated herein in its entirety by reference.

BACKGROUND

The inventive concept relates to a package and a method of fabricating the package, and more particularly, to a wafer level package and a method of fabricating the wafer level package.

Wafer level packaging techniques for forming wafer level packages such as a wafer level package (WLP), a wafer level fabricated package (WFP), or a wafer level chip scale package (WL-CSP) are being developed as next-generation packaging techniques.

Further, there is a demand for developing a wafer level package that can be fabricated at low manufacturing costs without a decrease in package function.

SUMMARY

The inventive concept provides a wafer level package that is fabricated at low manufacturing costs without a decrease in package function.

The inventive concept also provides a method of fabricating a wafer level package at low manufacturing costs without a decrease in package function.

In one embodiment, a wafer level package includes a rerouting pattern formed on a semiconductor substrate and a first encapsulant pattern overlying the rerouting pattern. The first encapsulant pattern has a via hole to expose a portion of the rerouting pattern. The package additionally includes an external connection terminal formed on the exposed portion of the rerouting pattern. An upper section of the sidewall and a sidewall of the external connection terminal may be separated by a gap distance. The gap distance may increase toward an upper surface of the encapsulant pattern.

In another embodiment, a sidewall of the via hole may have a stepped cross-section, such that the upper section of the sidewall has a larger diameter than a lower section.

In one embodiment, an external connection terminal may be substantially circular in cross-section, with a diameter that decreases adjacent the upper section of the sidewall.

BRIEF DESCRIPTION OF THE DRAWINGS

Exemplary embodiments of the inventive concept will be more clearly understood from the following detailed description taken in conjunction with the accompanying drawings in which:

FIG. 2 is a cross-sectional view of a wafer level package for comparing with the wafer level package of FIG. 1A;

DETAILED DESCRIPTION

Figure 1A:
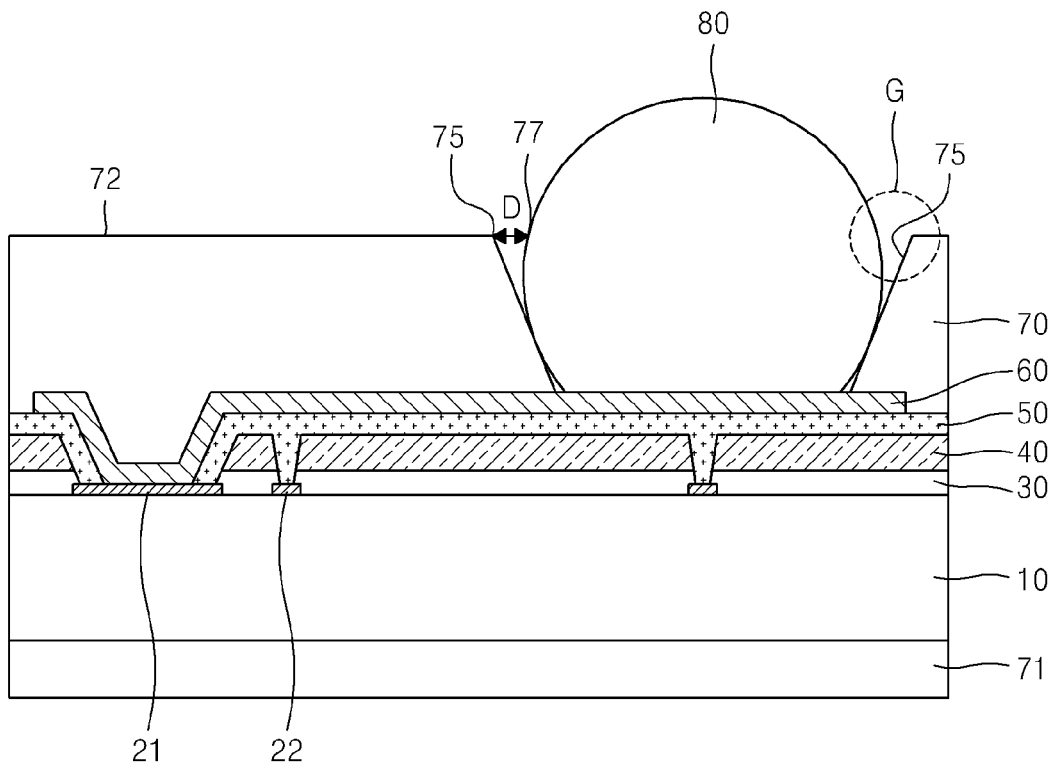
FIG. 1A is a cross-sectional view of a wafer level package according to an embodiment of the inventive concept.

Hereinafter, the exemplary embodiments will be described in detail with reference to the attached drawings. The embodiments may, however, have many different forms and should not be construed as being limited to those set forth herein; rather, these embodiments are provided so that this disclosure will be thorough and complete, and will fully convey the concept of the invention to those of ordinary skill in the art. In the drawings, the sizes of elements are exaggerated for clarity.

It will be understood that when an element, such as a layer, a region, or a substrate, is referred to as being "on" another element, it may be directly on the other element or intervening elements may be present. In contrast, when an element is referred to as being "directly on," another element, there are no intervening elements present. Like reference numerals refer to like elements throughout.

The terms "first," "second," and the like are used to describe various members, elements, regions, layers and/or parts, but these members, elements, regions, layers and/or parts are not limited by these terms. These terms are used only to distinguish one member, element, region, layer, or part from another member, element, region, layer, or part. Accordingly, a first member, element, region, layer, or part may denote a second member, element, region, layer, or part without deviating from the scope of the inventive concept.

Also, relative terms such as "top" or "upper" and "bottom" or "lower" may be used herein to describe a relationship between elements as illustrated in drawings. The relative terms may include other directions in additional to a direction shown in the drawings. For example, when a device is turned over in the drawings, elements that are described to exist on upper surfaces of other elements now exist on lower surfaces of the other elements. Accordingly, the term "upper" used as the example may include "lower" and "upper" directions based on a certain direction of the drawings. If a device faces another direction (90° rotation), the relative terms may be interpreted accordingly.

In the present specification, the term "layer" refers to a part of a structure formed by coupling objects. Accordingly, the term "layer" does not need to be limited by thicknesses of the objects.

First Embodiment

FIG. 1A is a cross-sectional view of a wafer level package according to an embodiment of the inventive concept.

Referring to FIG. 1, a rerouting pattern 60 may be disposed on a semiconductor substrate 10 in or on which semiconductor devices (not shown) are formed. The semiconductor substrate 10 may be a wafer substrate. The semiconductor devices may be formed inside the semiconductor substrate 10 and/or on an upper surface of the semiconductor substrate 10. The possible locations of the semiconductor devices will be apparent to those of ordinary skill in the art, and thus, will not be described in detail herein. A chip pad 21 and/or a fuse box 22 are formed on the upper surface of the semiconductor substrate 10. The chip pad 21 refers to an electrical connection portion for input of an electrical signal to the semiconductor device from an external device and/or for output of an electrical signal to the external device from the semiconductor device. The fuse box 22 represents a wiring for performing a repairing process for replacing a defective cell and a region surrounding the wiring.

A passivation layer pattern 30 is formed on the semiconductor substrate 10 in or on which a semiconductor device is formed. To form the passivation layer pattern 30, a passivation layer (not shown) covering the chip pad 21 and the fuse box 22 is formed and a portion of the passivation layer is then removed to expose the chip pad 21 and the fuse box 22.

A first polymer layer pattern 40 may then be formed on the passivation layer pattern 30. To form the first polymer layer pattern 40, a first polymer layer (not shown) is formed and then a portion of the first polymer layer is removed to expose the chip pad 21 and the fuse box 22.

A second polymer layer pattern 50 may then be formed on the first polymer layer pattern 40. In addition, the second polymer layer pattern 50 may directly contact a portion of the fuse box 22 that is exposed through the passivation layer pattern 30 and the first polymer layer pattern 40. The second polymer layer pattern 50 may expose at least a portion of the chip pad 21. The second polymer layer pattern 50 may, for example, be formed on the surface of the first polymer layer pattern 40 as shown in FIG. 1. In this regard, the second polymer layer pattern 50 may be formed in a fuse box region and an external connection terminal region.

The first polymer layer pattern 40 and/or the second polymer layer pattern 50 may include an epoxy resin. Alternatively, the first polymer layer pattern 40 and/or the second polymer layer pattern 50 may include polydimethylsiloxane (PDMS).

The second polymer layer pattern 50 may have a Young's modulus of about 2 MPa to about 2 GPa. In this regard, the Young's modulus represents an elastic modulus. For example, the Young's modulus of the second polymer layer pattern 50 may be in the range of about 2 MPa through about 900 MPa. More preferably, the Young's modulus of the second polymer layer pattern 50 may be in the range of about 10 MPa through about 200 MPa. The Young's modulus of the first polymer layer pattern 40 may be greater than that of the second polymer layer pattern 50, and in this regard, the second polymer layer pattern 50 may act as a stress-relaxation layer for relaxing a stress generated in the first polymer layer pattern 40.

The rerouting pattern 60 may be formed on the second polymer layer pattern 50. The rerouting pattern (or redistribution layer pattern) 60 may include a conductive material and allow the chip pad 21 and an external connection terminal 80 to be electrically connected to each other. In addition, the rerouting pattern 60 preferably enables the external connection terminal 80 to be arranged at any desirable location.

In some embodiments, the first polymer layer pattern 40 may be omitted and the second polymer layer pattern 50 may be formed on the passivation layer pattern 30 and the exposed fuse box 22 without an intervening layer therebetween. In addition, both the first polymer layer pattern 40 and the second polymer layer pattern 50 may be omitted. In this case, the rerouting pattern 60 may be directly formed on the passivation layer pattern 30.

In some embodiments, a first encapsulant pattern 70 may directly contact the rerouting pattern 60. In this regard, the wording 'directly contacts' means that an intervening layer is not disposed between the first encapsulant pattern 70 and the rerouting pattern 60. For example, an additional polymer layer may not be interposed between the first encapsulant pattern 70 and the rerouting pattern 60.

The first encapsulant pattern 70 may include a filler-containing material such as a filler-containing epoxy mold compound (EMC). However, the filler-containing material is not limited thereto and may also be other suitable filler-containing materials such as a filler-containing PDMS.

Figure 17:
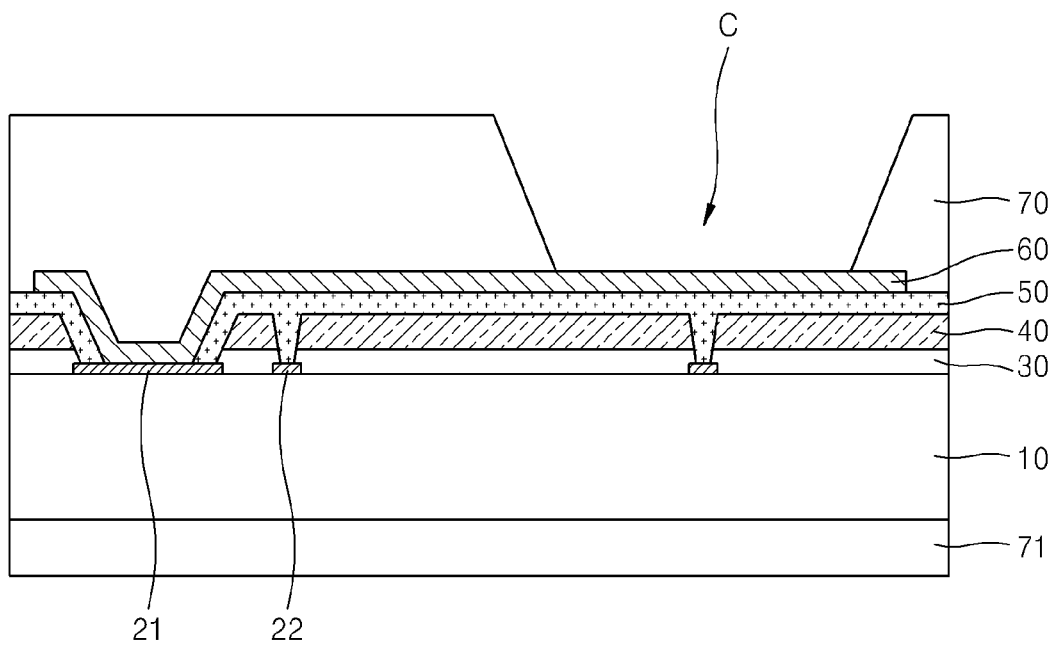

The first encapsulant pattern 70 may have a via hole (see, e.g., C of FIG. 17.). The via hole may pass through the first encapsulant pattern 70 and may expose a portion of the rerouting pattern 60. The via hole may have a tapered shape having a wider upper portion and a narrower lower portion. For example, the via hole may have a tapered shape that narrows downward and has a circular cross-section. However, the via hole may also have a different shape, for example, a cylindrical shape instead of a tapered shape.

According to some embodiments, a sidewall 75 of the via hole may form an acute angle with respect to a plane of the substrate 10 when viewed in cross-section.

The external connection terminal 80 may be formed on the portion of the rerouting pattern 60 that is exposed through the via hole. For example, the external connection terminal 80 may be a conductive ball such as a solder ball, but is not limited thereto. For example, the external connection terminal 80 may alternatively be a solder bump. The external connection terminal 80 may protrude from an upper surface 72 of the first encapsulant pattern 70.

The external connection terminal 80 may contact a portion of a sidewall 75 of the via hole and may be separated from an upper portion of the sidewall of the via hole by a gap G. In this manner, a top edge portion of the first encapsulant pattern 70 may be spaced apart from the external connection terminal to define a gap therebetween.

In some embodiments, therefore, an upper section of the sidewall 75 and a sidewall 77 of the external connection terminal 80 may be separated by a gap distance D. The gap distance may increase toward an upper surface 72 of the first encapsulant pattern 70. The external connection terminal 80 may be strongly fixed to the rerouting pattern 60 because the first encapsulant pattern 70 may surround and directly contact the external connection terminal 80 while the external connection terminal 80 is separated from an upper portion of a sidewall of the via hole by a gap G. This structure may be easily provided where the via hole has a tapered shape that narrows downward and where the external connection terminal 80 is a solder ball.

The gap between the external connection terminal 80 and the upper portion of the sidewall of the via hole results from forming the external connection terminal 80 (for example, a solder ball) after first the encapsulant pattern 70 is formed. Because the first encapsulant pattern 70 may surround and directly contact the external connection terminal 80, the external connection terminal 80 can be strongly fixed to the rerouting pattern 60.

According to some embodiments, the external connection terminal 80 may be formed after the first encapsulant pattern 70 is formed. However, if the external connection terminal 80 (for example, a solder ball) is formed and then the first encapsulant pattern 70 is formed in an attaching and reflowing process of a solder ball, solder may flow over a solder ball region, thereby wetting in the surrounding region. Accordingly, the first encapsulant pattern 70 may also define an external connection terminal region.

Additionally, a back-side protection (BSP) layer 71 may be further formed on a lower surface of the semiconductor substrate 10. The BSP layer 71 may protect the semiconductor substrate 10 from surrounding environment. However, in another embodiment, the BSP layer 71 need not be formed.

Figure 1B:
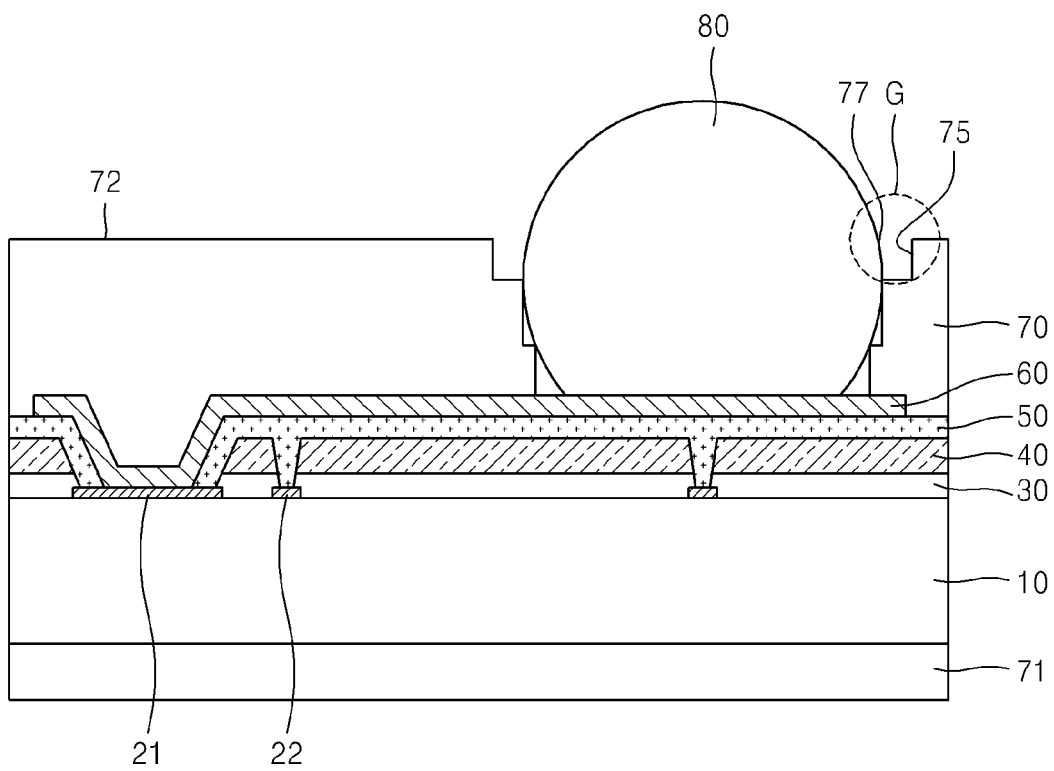
FIG. 1B is a cross-sectional view of a wafer level package according to another embodiment of the inventive concept
Figure 5:
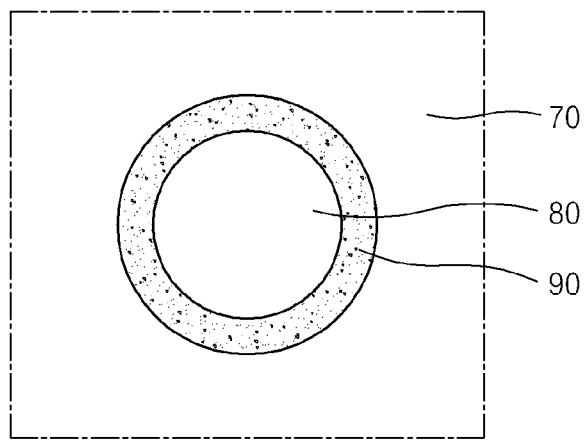
FIG. 5 is a top view illustrating an example of a second encapsulant pattern located along a boundary of an external connection terminal.

Accordingly, as explained above, according to some embodiments, the external connection terminal 70 may be substantially circular in cross-section, with a diameter that decreases adjacent the upper section of the sidewall 75. In addition, as shown in FIG. 1B, a sidewall 75a of the via hole may have a stepped cross-section, such that the upper section of the sidewall has a larger diameter than a lower section. According to another aspect, the gap G may surround a boundary of the external connection terminal in plan view as shown in FIG. 5. Further, the width of the gap G may be substantially uniform in plan view.

FIG. 2 is a cross-sectional view of a wafer level package for comparison with the wafer level package of FIG. 1.

Referring to FIG. 2, unlike FIG. 1, a polymer layer pattern 55 is additionally formed between the rerouting pattern 60 and a first encapsulant pattern 75. In addition, there is no gap between the first encapsulant pattern 75 and the external connection terminal 80. If the solder ball 80 is formed and then the first encapsulant pattern 75 is formed, the polymer layer pattern 55 may additionally be required to be formed on the rerouting pattern 60 to define a solder ball region. If the polymer layer pattern 55 is not additionally formed, when the solder ball 80 undergoes the attaching and reflowing process, the solder may wet other regions over the solder ball region. Unfortunately, however, when the polymer layer pattern 55 is added, manufacturing costs may increase.

Because the external connection terminal 80 is formed after the polymer layer pattern 55 is formed, the first encapsulant pattern 75 may be formed after the external connection terminal 80 is formed. Accordingly, in this embodiment, the first encapsulant pattern 75 is not separated from the external connection terminal 80 by a gap. This structure, however, may result in the external connection terminal 80 becoming detached from the rerouting pattern 60 by water vapor pressure, which will be described in detail later.

Further Embodiment

Figure 3:
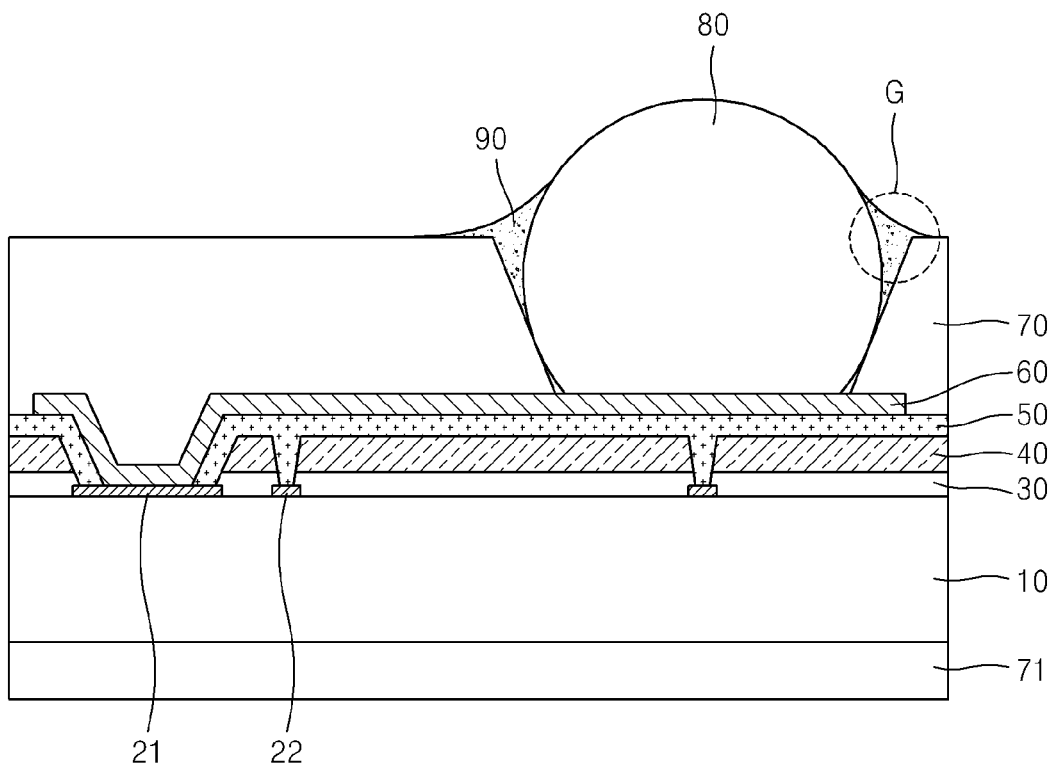
FIG. 3 is a cross-sectional view of a wafer level package according to another embodiment of the inventive concept.

FIG. 3 is a cross-sectional view of a wafer level package according to another embodiment of the inventive concept. Referring to FIGS. 1 and 3, like reference numerals refer to like elements. Accordingly, like elements that have been described previously will not be further described herein.

Referring now to FIG. 3, the external connection terminal 80 contacts a portion of the sidewall of the via hole and is separated from the upper portion of the sidewall of the via hole by the gap G. That is, the external connection terminal 80 may be strongly fixed to the rerouting pattern 60 in such a way that the first encapsulant pattern 70 may surround and directly contact the external connection terminal 80 while the external connection terminal 80 is separated from the upper portion of a sidewall of the via hole by the gap G. However, some embodiments of the present application can also be employed without the first encapsulant pattern 70 directly contacting the external connection terminal 80. In other words, if necessary, there can be an additional layer formed between the first encapsulant pattern 70 and the external connection terminal 80.

FIG. 3 further illustrates a second encapsulant pattern 90 which can be arranged along a boundary of the external connection terminal 80, substantially filling the gap G.

FIG. 5 is a top view illustrating an example of the second encapsulant pattern 90 located along the boundary of the external connection terminal 80. Referring to FIGS. 3 and 5, the second encapsulant pattern 90 may substantially surround the boundary of the external connection terminal 80 while substantially filling the gap G. Since the second encapsulant pattern 90 can substantially surround the boundary of the external connection terminal 80, the external connection terminal 80 may be more strongly fixed. However, in another embodiment, the second encapsulant pattern 90 may surround only a portion of the boundary of the external connection terminal 80 as shown in FIG. 6.

Figure 6:
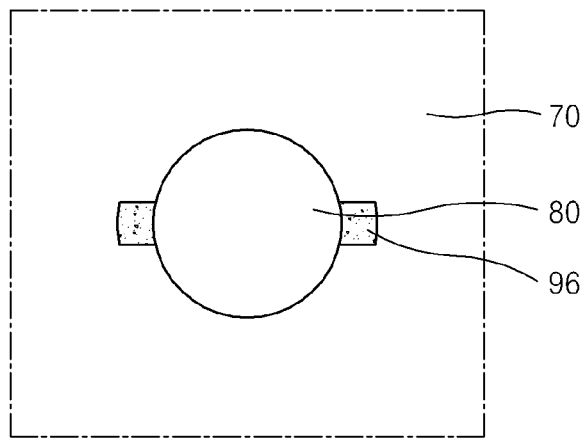
FIG. 6 is a top view illustrating another example of a second encapsulant pattern located along a boundary of an external connection terminal.

FIG. 6 is a top view illustrating another example of the second encapsulant pattern 96 located along the boundary of the external connection terminal 80. Referring now specifically to FIG. 6, a second encapsulant pattern 96 may surround a portion of the boundary of the external connection terminal 80 while substantially filling the gap G. For example, the second encapsulant pattern 96 may be arranged at opposing portions of the boundary of the external connection terminal 80. Although the second encapsulant pattern 96 has two portions shown n FIG. 6, if desired, the second encapsulant pattern 96 may alternatively have three or more portions disposed at different locations around the boundary of the external connection terminal 80.

Referring back to FIG. 3, the second encapsulant pattern 90 may include a material through which water vapor more easily passes than a material of the first encapsulant pattern

70. For example, if the first encapsulant pattern 70 includes a filler-containing EMC, the second encapsulant pattern 90 may include PDMS.

Normally, the first encapsulant pattern 70 may include a material for sealing in a semiconductor package process, for example, rubber, an epoxy-based resin, a polymide-based resin polymer, or a fluoride-based resin polymer, each of which does not have water permeability. In one embodiment, the second encapsulant pattern 90 may include a PDMS-based resin. The PDMS-based resin allows water to more easily permeate therethrough than the material of the first encapsulant pattern 70.

If the second encapsulant pattern 90 is formed, detachment of the external connection terminal 80 from the rerouting pattern 60 as a result of water vapor pressure may be substantially prevented. This detachment-prevention function of the second encapsulant pattern 90 will be described in detail later.

Figure 8:
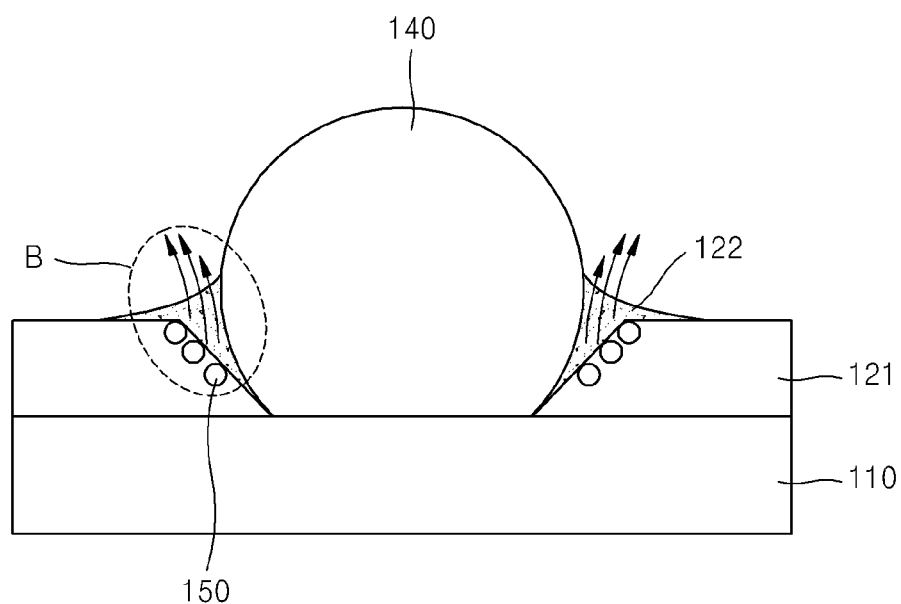
FIG. 8 is a cross-sectional view of a wafer level package, illustrating a water vapor flow pathway when a second encapsulant pattern is formed.

FIG. 8 is a cross-sectional view of a wafer level package, illustrating a water vapor flow pathway when a second encapsulant pattern 122 is formed. The structure of FIG. 8 is like the structure of FIG. 3. Accordingly, a layer 110 formed under the first encapsulant pattern 121 may be a rerouting pattern (see, e.g., the rerouting pattern 60 of FIG. 3).

Referring to FIG. 8, water vapor 150 in the first encapsulant pattern 121 may accumulate on a sidewall of a via hole of the first encapsulant pattern 121 (see dashed oval B.) A water absorption test may be performed in a conventional package fabrication process, changing water contained in the first encapsulant pattern 121 into water vapor and thereby creating water vapor pressure.

When the second encapsulant pattern 122 fills the gap between the upper portion of the sidewall of the via hole and the external connection terminal 140, the water vapor 150 creating the water vapor pressure can evaporate through the second encapsulant pattern 122 having water permeability (represented by arrows in the dashed oval B.) Accordingly, due to the formation of the second encapsulant pattern 122, a force imposed by the water vapor 150 on the external connection terminal 140 may be negligible.

Figure 7:
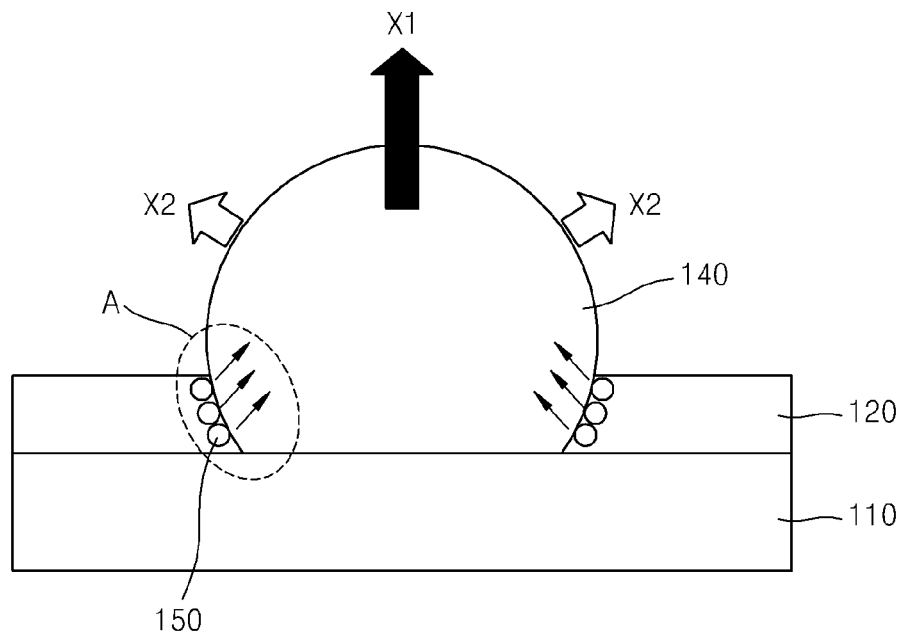
FIG. 7 is a cross-sectional view of a wafer level package, illustrating a water vapor flow pathway when a second encapsulant pattern is not formed.

FIG. 7 is a cross-sectional view of a wafer level package, illustrating the water vapor flow pathway when a second encapsulant pattern is not formed and where no gap exists between the upper portion of the sidewall of the via hole and the external connection terminal 140. The structure of FIG. 7 will be compared with the structure of FIG. 8. The structure of FIG. 7 is similar to the structure of FIG. 2. Accordingly, a layer 110 disposed under a first encapsulant pattern 120 may be a rerouting pattern (see 60 of FIG. 2). For the sake of simplicity, the polymer layer pattern (see 55 of FIG. 2) is not illustrated in FIG. 7.

Referring to FIG. 7, water vapor 150 in the first encapsulant pattern 120 may accumulate on a sidewall of a via hole of the first encapsulant pattern 120 (see dashed oval A.) Again, a water absorption test performed in a conventional package fabrication process changes water contained in the first encapsulant pattern 120 into water vapor, thereby creating water vapor pressure.

Since there is no gap between the sidewall of the via hole of the first encapsulant pattern 120 and the external connection terminal 140, the water vapor pressure applies a force that pushes the external connection terminal 140 in the directions represented by arrows X2 of FIG. 7. Due to the sum of the forces generated by the forces in the directions represented by arrows X2, a resultant force pushes the external connection terminal 140 in a direction represented by arrow X1. This resultant force may eventually cause the external connection terminal 140 to detach from the rerouting pattern 110.

Referring back to FIG. 3, various aspects of the previously-described embodiments can solve this problem. More particularly, where a gap G is formed between the first encapsulant pattern 70 and the external connection terminal 80, and where a second encapsulant pattern 90 with water permeability fills the gap G, the possibility of detachment of the external connection terminal 80 from the rerouting pattern 60 as a result of water vapor pressure may be significantly reduced.

According to an aspect of the inventive concept, the external connection terminal 80 may protrude from an upper surface 72 of the first encapsulant pattern 70 and accordingly, the second encapsulant pattern 90 that fills the gap G may also protrude from an upper surface 72 of the first encapsulant pattern 70 along the boundary of the external connection terminal 80. However, the shape of the second encapsulant pattern 90 may vary.

Figure 4:
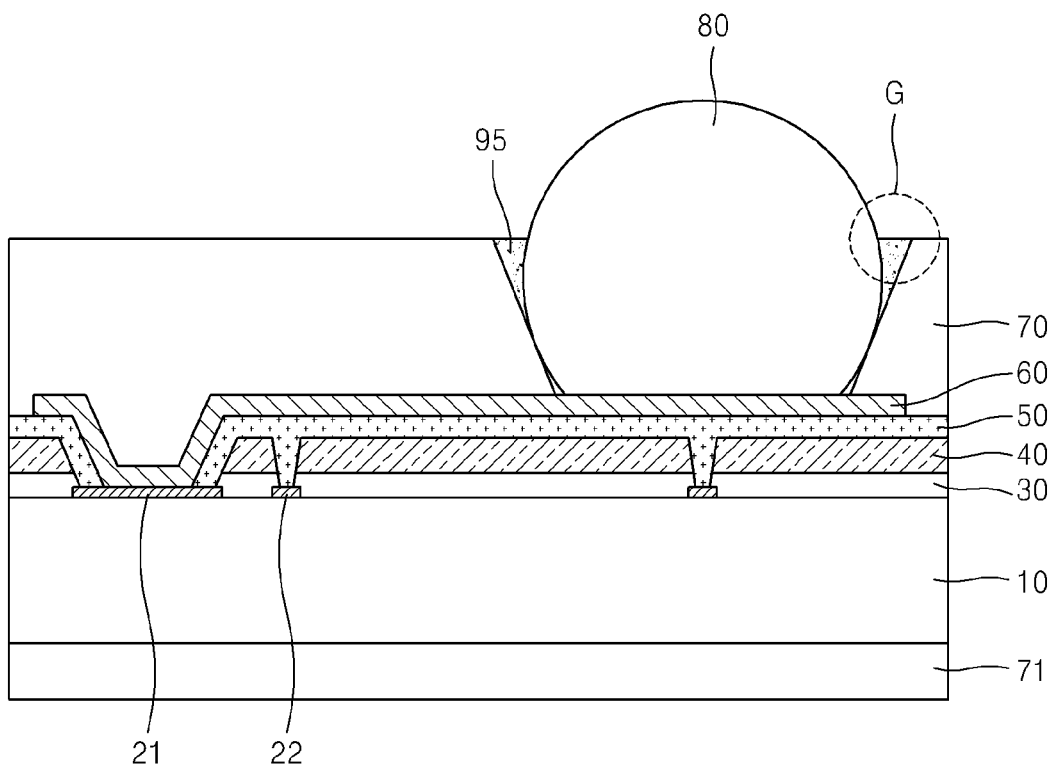
FIG. 4 is a cross-sectional view of a wafer level package according to another embodiment of the inventive concept.

FIG. 4 is a cross-sectional view of a wafer level package according to another embodiment of the inventive concept. Referring to FIGS. 3 and 4, like reference numerals refer to like elements. Accordingly, like elements which have been described previously in connection to FIG. 3 may not be further described herein.

Referring to FIG. 4, a second encapsulant pattern 95 that fills the gap G may have an upper surface arranged on substantially the same plane as or substantially planar with an upper surface 72 of the first encapsulant pattern 70. If the second encapsulant pattern 95 that fills the gap G protrudes from the upper surface 72 of the first encapsulant pattern 70 along the external connection terminal 80 (as shown, for example, in FIG. 3), the surface area of an exposed portion of the external connection terminal 80 may be reduced. A decreased surface area may be undesirable in terms of an electrical connection with the outside because of the possibility of degradation of solder joints, e.g., the joint between the external connection terminal 80 and the rewiring pattern 60. Accordingly, when the second encapsulant pattern 95 that fills the gap G forms a plane together with the upper surface 72 of the first encapsulant pattern 70, the above problems may be reduced.

Further Embodiment

Figure 9:
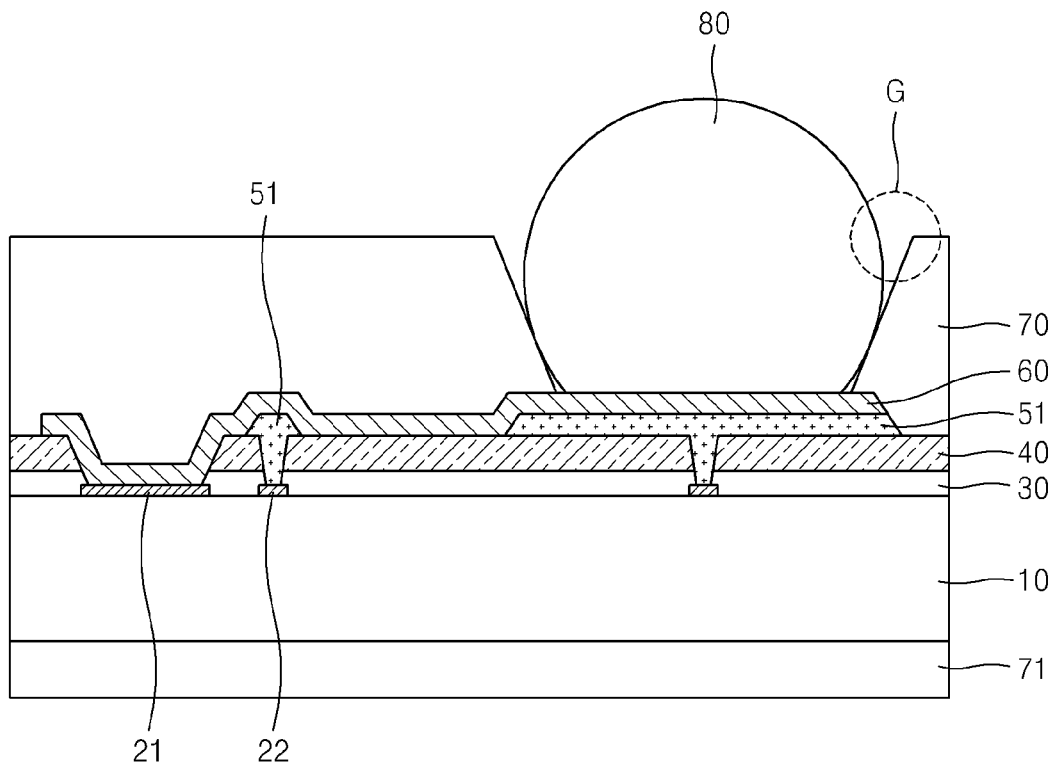
FIG. 9 is a cross-sectional view of a wafer level package according to another embodiment of the inventive concept.

FIG. 9 is a cross-sectional view of a wafer level package according to another embodiment of the inventive concept. Referring to FIGS. 9 and 1, like reference numerals refer to like elements. Accordingly, like elements which have been described previously may not be further described herein.

Referring to FIG. 9, a second polymer layer pattern 51 may be formed on the first polymer layer pattern 40. In addition, the second polymer layer pattern 51 may directly contact a portion of the fuse box 22 exposed by the passivation layer pattern 30 and the first polymer layer pattern 40. However, depending on the desired application, one or more additional material layers may be disposed between the second polymer layer pattern 51 and the first polymer layer pattern 40.

In FIG. 1, the second polymer layer pattern 50 is formed on substantially the entire surface of the first polymer layer pattern 40. In this regard, adhesiveness-related problems may occur with respect to layers, and other process problems may also occur.

Unlike the structure of FIG. 1, in FIG. 9, the second polymer layer pattern 51 is formed on the first polymer layer pattern 40 only in a fuse box region and an external connection terminal region. Accordingly, the problems described above may be reduced.

Figure 10:
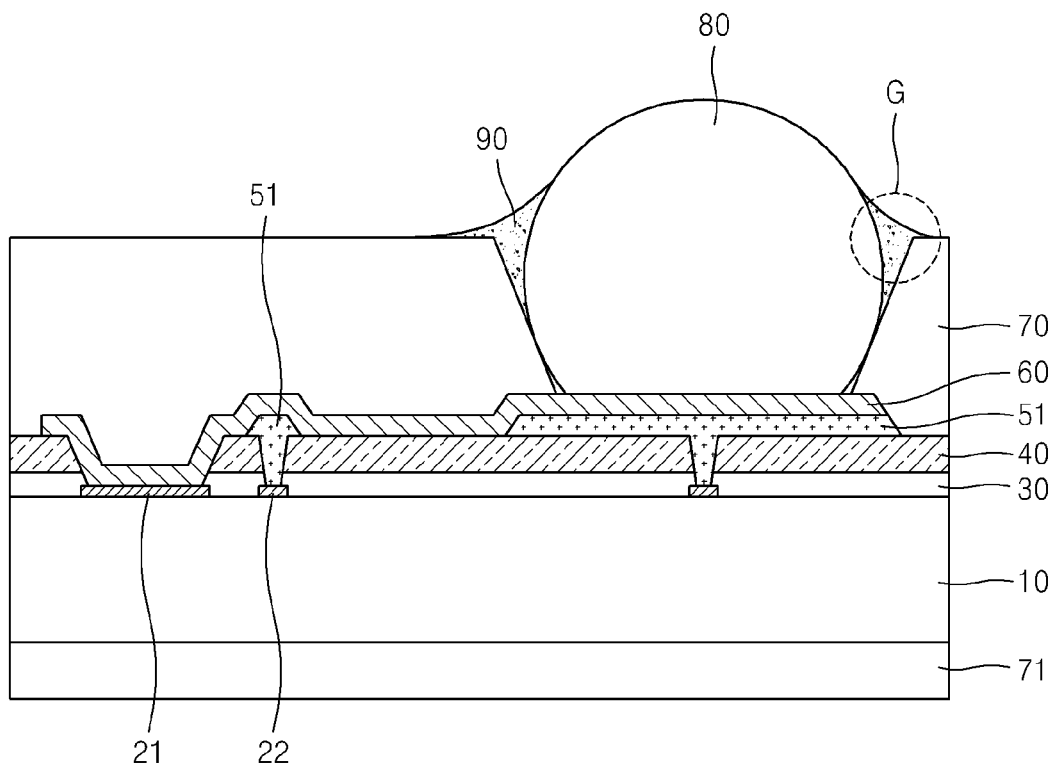
FIG. 10 is a cross-sectional view of a wafer level package according to another embodiment of the inventive concept.

FIG. 10 is a cross-sectional view of a wafer level package according to another embodiment of the inventive concept.

Referring to FIGS. 10 and 3, like reference numerals refer to like elements and like elements which have been described previously may not be further described herein.

Referring to FIG. 10, a second polymer layer pattern 51 may be formed on the first polymer layer pattern 40. In addition, the second polymer layer pattern 51 may directly contact a portion of the fuse box 22 exposed by the passivation layer pattern 30 and the first polymer layer pattern 40. However, depending on the desired application, one or more additional material layers may be disposed between the second polymer layer pattern 51 and the first polymer layer pattern 40.

In FIG. 3, the second polymer layer pattern 50 is formed on substantially the entire surface of the first polymer layer pattern 40. In this regard, adhesiveness-related problems may occur with respect to layers, and other process problems may also occur.

Unlike the structure of FIG. 3, in FIG. 10, the second polymer layer pattern 51 may be formed on the first polymer layer pattern 40 only in a fuse box region and an external connection terminal region. Accordingly, the problems described above may be reduced.

Figure 11:
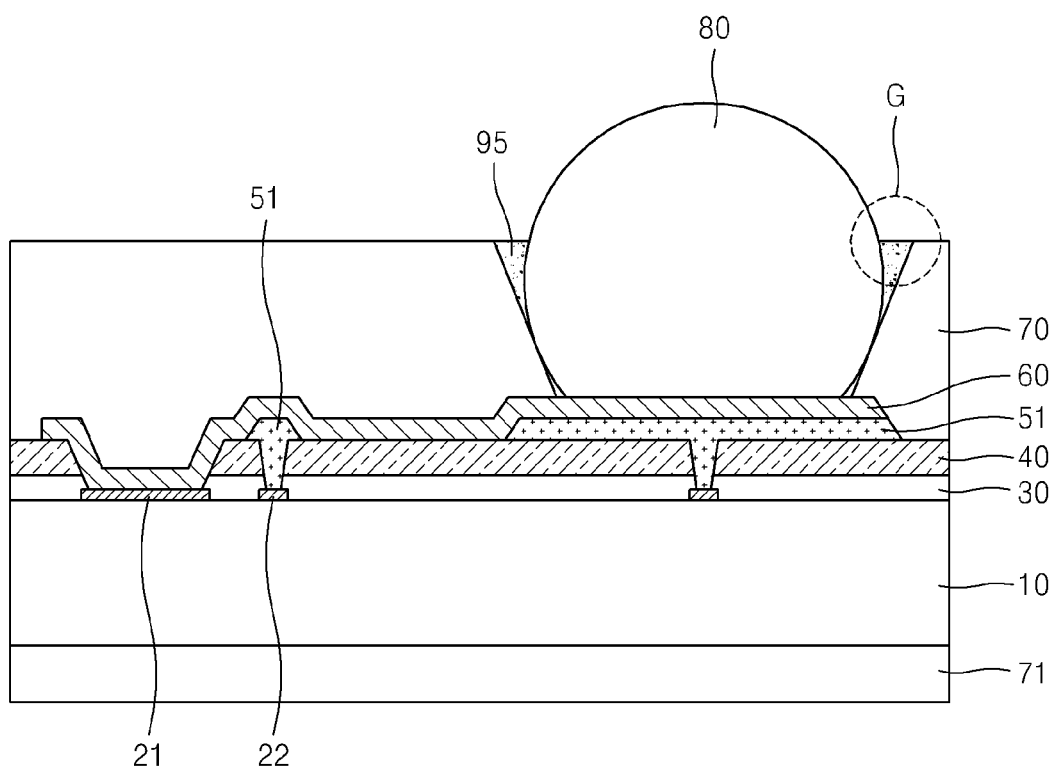
FIG. 11 is a cross-sectional view of a wafer level package according to another embodiment of the inventive concept.

FIG. 11 is a cross-sectional view of a wafer level package according to another embodiment of the inventive concept. Referring to FIGS. 11 and 4, like reference numerals refer to like elements and like elements which have been described previously may not be further described herein.

Referring to FIG. 11, the second polymer layer pattern 51 may be formed on a portion of the first polymer layer pattern 40. In addition, the second polymer layer pattern 51 directly contacts a portion of the fuse box 22 that is exposed by the passivation layer pattern 30 and the first polymer layer pattern 40.

In FIG. 4, the second polymer layer pattern 50 is formed on substantially the entire surface of the first polymer layer pattern 40. In this regard, adhesiveness-related problems may occur with respect to layers, and other process problems may also occur.

Unlike the structure of FIG. 4, in FIG. 11, the second polymer layer pattern 51 may be formed on the first polymer layer pattern 40 only in a fuse box region and an external connection terminal region. Accordingly, the problems described above may be reduced.

Additional Embodiment

FIGS. 12 through 19 are cross-sectional views for sequentially explaining a method of fabricating a wafer level package, according to an embodiment of the inventive concept.

Figure 12:
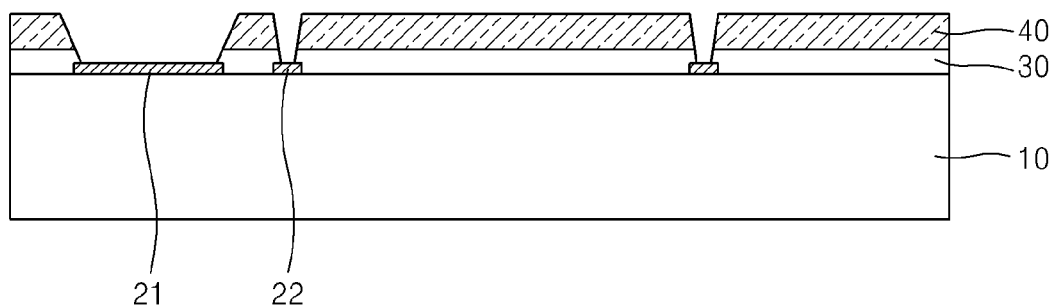
FIGS. 12 through 19 are cross-sectional views for sequentially explaining a method of fabricating a wafer level package, according to an embodiment of the inventive concept.

Referring to FIG. 12, the passivation layer pattern 30 and the first polymer layer pattern 40 may be sequentially formed on a semiconductor substrate 10. The semiconductor substrate 10 may be a wafer substrate. A semiconductor device (not shown) may be formed inside the semiconductor substrate 10 and/or on an upper surface of the semiconductor substrate 10. The locations of the semiconductor devices may be readily apparent to those of ordinary skill in the art, and thus, will not be described in detail herein. A chip pad 21 and/or a fuse box 22 can be formed on the upper surface of the semiconductor substrate 10. The chip pad 21 refers to an electrical connection portion for input of an electrical signal to the semiconductor device from an external device and/or for output of an electrical signal to the external device from the semiconductor device. The fuse box 22 can be a wiring for performing a repairing process for replacing a defective cell and a region surrounding the wiring.

The passivation layer pattern 30 and the first polymer layer pattern 40 may be formed to expose at least a portion of the chip pad 21 and at least a portion of the fuse box 22. The passivation layer pattern 30 and the first polymer layer pattern 40 may be formed by photolithography. However, since photolithography is an expensive process, the passivation layer pattern 30 and the first polymer layer pattern 40 may also be formed using a less expensive process such as a soft-lithography process. These processes may include, for instance, a stencil printing process, a screen printing process, an ink-jet printing process, an offset printing process (e.g., roll offset printing process), imprinting process or an air-jet process. The passivation layer pattern 30 and the first polymer layer pattern 40 may be cured by using the subsequent heat treatment process.

Figure 13:
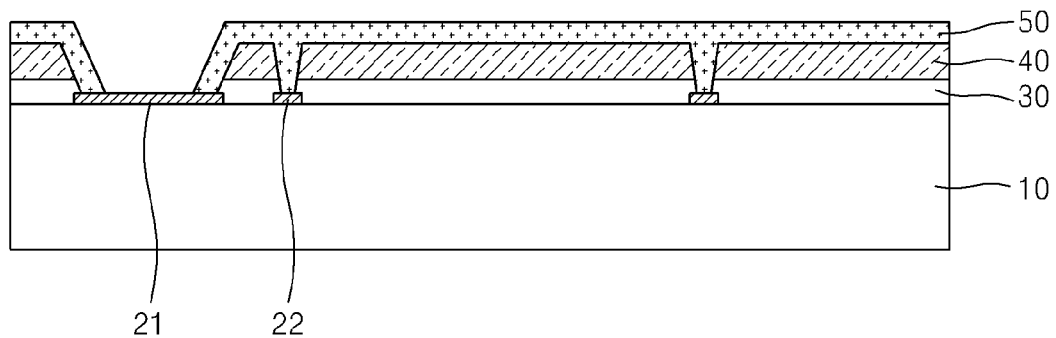

Referring to FIG. 13, the second polymer layer pattern 50 may be formed on the first polymer layer pattern 40. Also, the second polymer layer pattern 50 may be formed to directly contact a portion of the fuse box 22 that is exposed through the passivation layer pattern 30 and the first polymer layer pattern 40. In addition, the second polymer layer pattern 50 may be formed to directly contact a portion of the chip pad 21 exposed by the passivation layer pattern 30 and the first polymer layer pattern 40 while exposing a portion of the chip pad 21 for external connection.

To improve joint reliability of an external connection terminal 80 which is to be formed in the subsequent process, the second polymer layer pattern 50 may have high elasticity so that the second polymer layer pattern 50 sufficiently absorbs stress from the outside of the package.

The second polymer layer pattern 50 may include an epoxy resin. Alternatively, the second polymer layer pattern 50 may include PDMS.

The second polymer layer pattern 50 may be formed by photolithography. However, since photolithography is an expensive process, the second polymer layer pattern 50 may also be formed by using a less expensive process such as a soft-lithography process. The soft-lithography process may include, for instance, a stencil printing process, a screen printing process, an ink-jet printing process, an imprinting process, an offset printing process. The second polymer layer pattern 50 may be cured by using a subsequent heat treatment process.

As described above, the first polymer layer pattern 40 and/or the second polymer layer pattern 50 may be formed by using a soft-lithography process such as a roll offset printing process. A roll offset printing process is a process in which a pattern is transferred to a substrate by using a soft roll formed of, e.g., PDMS. The roll offset printing process may, for instance, include a gravure offset printing process, a reverse offset printing process, and a plate-to-plate offset printing process. FIGS. 37 through 47 are views to explain several types of a roll offset printing processes in detail.

Figure 40:
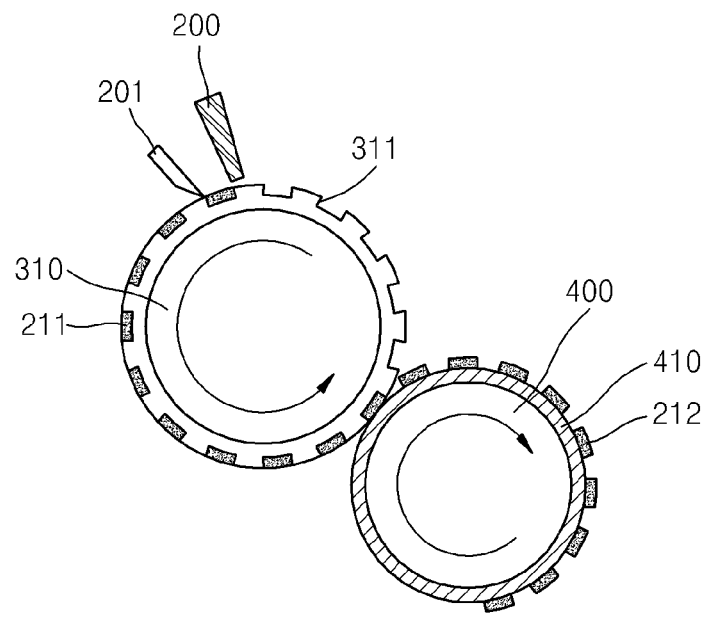
FIGS. 40 and 41 are conceptual views illustrating a gravure offset printing process.
Figure 41:
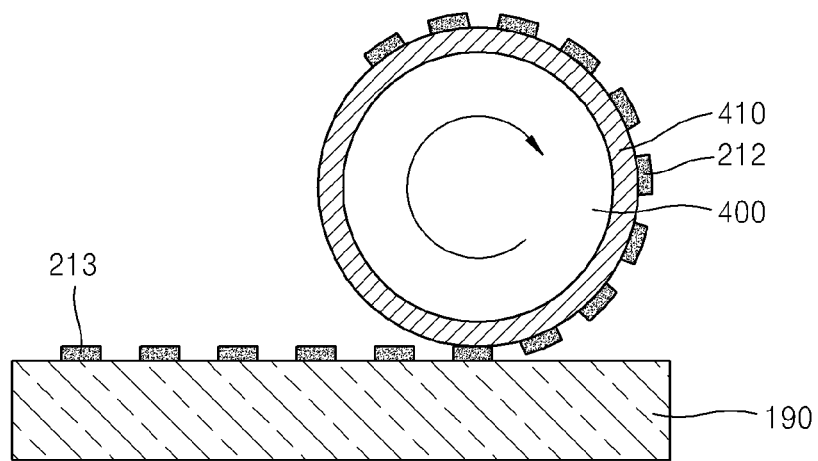

FIGS. 40 through 41 are schematic illustrations to explain a gravure offset printing process.

Referring to FIG. 40, a supply unit 200 provides a liquid material 211 to fill grooves 311 of a gravure roll 310. For example, the liquid material 211 may be a liquid epoxy material. A liquid material coated on the other portions over the grooves 311 of the gravure roll 310 may be removed by using a blade 201. The grooves 311 may be continually filled with the liquid material 211 while the gravure roll 310 rotates, for example, in a counter-clockwise direction.

In some embodiments, a blanket roll 400 may contact the gravure roll 310, and rotate in an opposite direction to the gravure roll 310, for example, in a clockwise direction. A blanket sheet 410 may encompass or surround a circumference of the blanket roll 400. The blanket sheet 410 may include PDMS which has elasticity and a low surface energy of 18 dyn/cm.

At the interface between the gravure roll 310 and the blanket roll 400, the liquid material 211 filling the grooves 311 of the gravure roll 310 detaches from the grooves 311 and then attaches to the blanket sheet 410 encompassing or surrounding the circumference of the blanket roll 400, thereby forming a first pattern 212. The detachment and attachment occur due to the fact that the surface energy of epoxy that forms the liquid material 211 is 35 dyn/cm and the surface energy of PDMS that forms the blanket sheet 410 is 18 dyn/cm.

Referring to FIG. 41, the blanket roll 400 contacts a substrate 190 while rotating. In this regard, the first pattern 212 on the blanket sheet 410 encompassing the circumference of the blanket roll 400 is detached and then attached onto the substrate 190, thereby forming a second pattern 213. The substrate 190 may be any one of the semiconductor substrate 10, the passivation layer pattern 30, the first polymer layer pattern 40, or the second polymer layer pattern 50 which have been described previously in connection with FIGS. 1 through 36. In addition, the second pattern 213 may be any one of the passivation layer pattern 30, the first polymer layer pattern 40, and the second polymer layer pattern 50, or the rerouting pattern 60 which have been described in connection with FIGS. 1 through 36.

The transfer of a pattern from a blanket roll onto a substrate will be described with reference to FIGS. 37 through 39.

Figure 37:
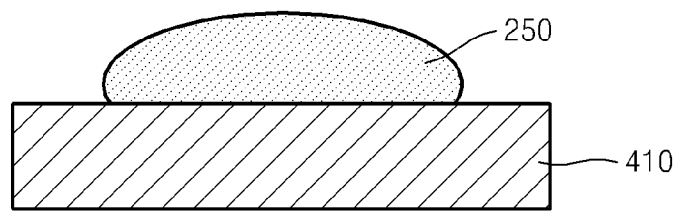
FIGS. 37 through 39 are conceptual views to explain a pattern transfer mechanism from a blanket roll to a substrate.

Referring to FIG. 37, a liquid material 250 may be attached to the blanket sheet 410 formed of a material such as PDMS. The liquid material 250 may be a material that includes a solvent, and, for example, a liquid epoxy material. Referring to FIG. 37, the liquid material 250 may be, for example, a material that forms the first pattern 212 of FIG. 40.

Figure 38:
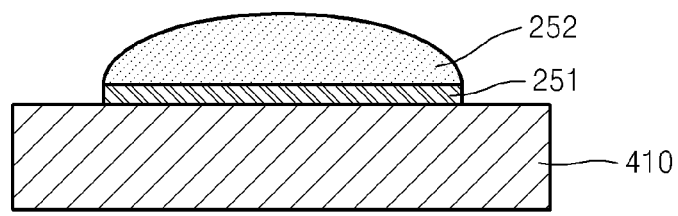

Referring to FIG. 38, the blanket sheet 410 formed of PDMS absorbs a solvent that is contained in the liquid material 250. Accordingly, the liquid material 250 on the blanket sheet 410 is divided into a solvent-free solid boundary portion 251 and a liquid residual 252. Due to the solvent-free solid boundary portion 251, an adhesive force between the liquid residual 252 and the blanket sheet 410 may be reduced. In FIG. 38, the solvent-free solid boundary portion 251 and the liquid residual 252 may constitute, for example, the first pattern 212 of FIG. 41.

Figure 39:
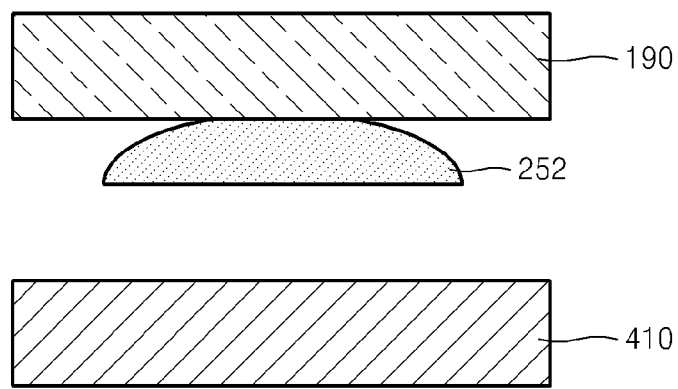

Referring to FIG. 39, when the liquid residual 252 is brought into contact with the substrate 190, since the liquid residual 252 has a stronger adhesive force with respect to the substrate 190 than the blanket sheet 410, the liquid residual 252 detaches from the blanket sheet 410 and attaches to the substrate 190. The liquid residual 252 of FIG. 39 may constitute, for example, the second pattern 213 of FIG. 41.

Figure 42:
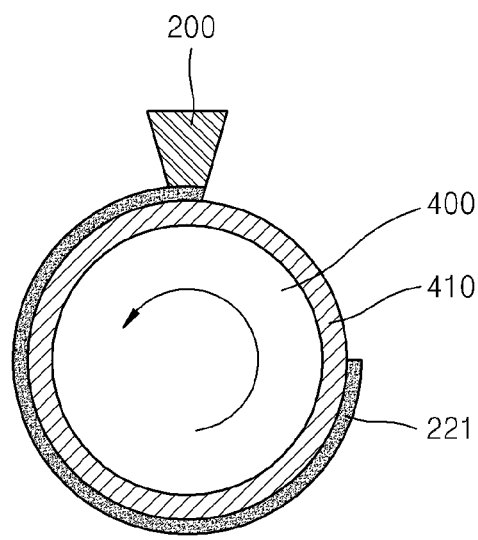
FIGS. 42 through 44 are conceptual views illustrating a reverse offset printing process.
Figure 43:
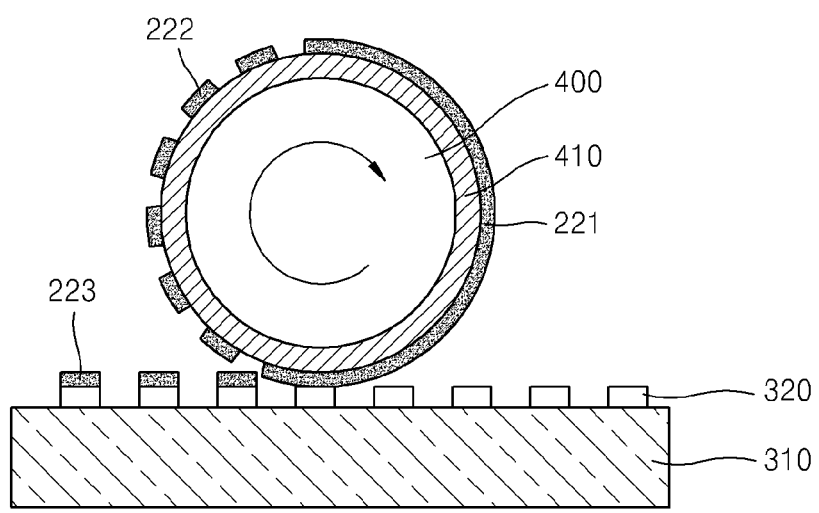
Figure 44:
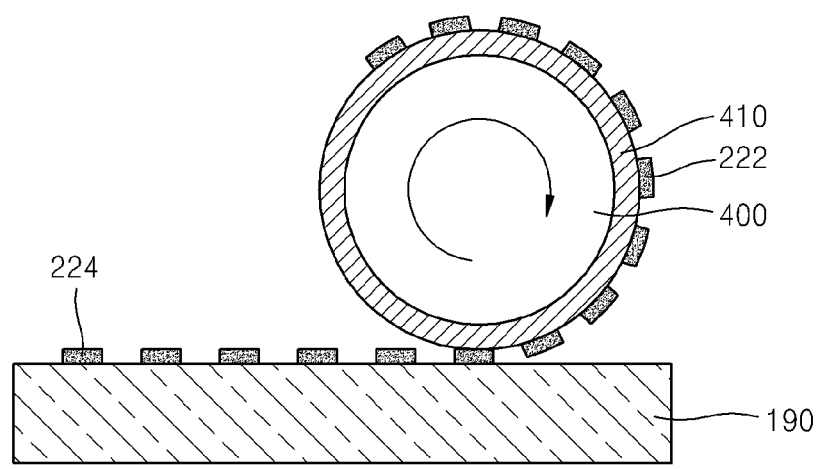

FIGS. 42 through 44 are conceptual views to explain a reverse offset printing process.

Referring to FIG. 42, a blanket sheet 410 encompasses a circumference of a blanket roll 400. The blanket sheet 410 may include, for example, PDMS. When a liquid material 221 is supplied to the blanket roll 400 by a supplier 200 while the blanket roll 400 rotates, the liquid material 221 is coated on the blanket sheet 410.

Referring to FIG. 43, a reverse pattern 320 is formed on a reverse pattern plate 310. When the blanket roll 400 of FIG. 42 contacts the reverse pattern plate 310 while the blanket roll 400 rotates, a portion 223 of the liquid material 221 that contacts the reverse pattern 320 detaches from the blanket sheet 410 and attaches to the reverse pattern 320. Meanwhile, the residual portion 222 of the liquid material 221 that does not contact the reverse pattern 320 forms a first pattern 222.

This process is possible due to the differences in the adhesive forces of the liquid material 221, the blanket sheet 410, and the reverse pattern 320 when the liquid material 221 includes a liquid epoxy material, the blanket sheet 410 includes PDMS, and the reverse pattern 320 includes glass.

Referring to FIG. 44, the blanket roll 400 rotates while in contact with a substrate 190. In this regard, the first pattern 222 on the blanket sheet 410 encompassing the circumference of the blanket roll 400 detaches from the blanket sheet 410 and attaches to the substrate 190, thereby forming a second pattern 224. The substrate 190 may be any one of the semiconductor substrate 10, the passivation layer pattern 30, the first polymer layer pattern 40, and the second polymer layer pattern 50 which have been described previously in connection with FIGS. 1 through 36. The second pattern 224 may be any one of the passivation layer pattern 30, the first polymer layer pattern 40, and the second polymer layer pattern 50, and the rerouting pattern 60 which have been described previously in connection with FIGS. 1 through 36.

The transfer mechanism from a blanket roll to a substrate may be understood with reference to FIGS. 37 through 39, and has already been described in connection with the gravure offset printing process, and thus, will not be further described herein.

Figure 45:
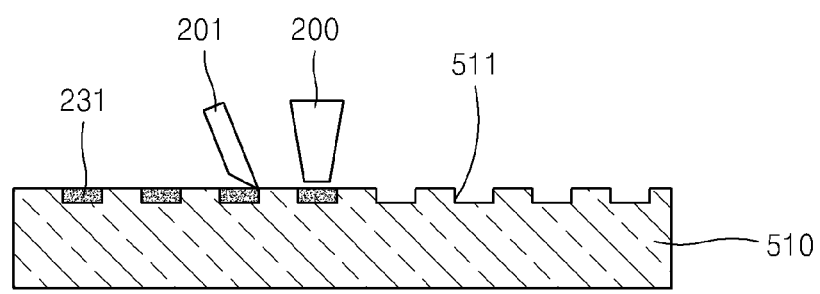
FIGS. 45 through 47 are conceptual views illustrating a plate-to-plate offset printing process.
Figure 46:
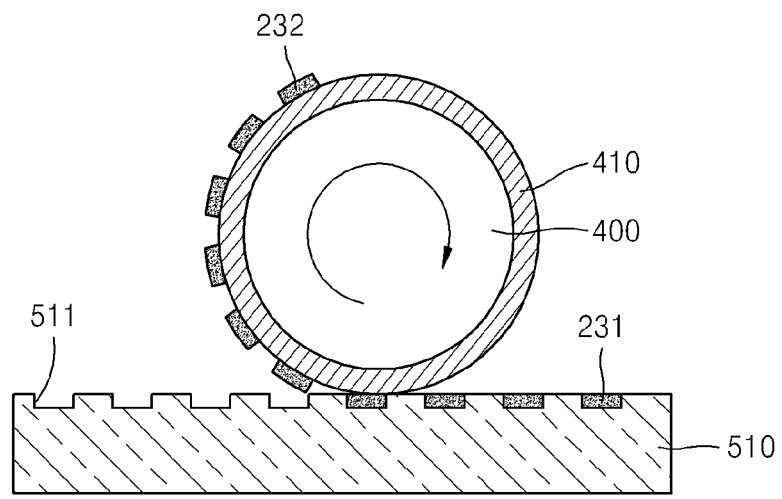
Figure 47:
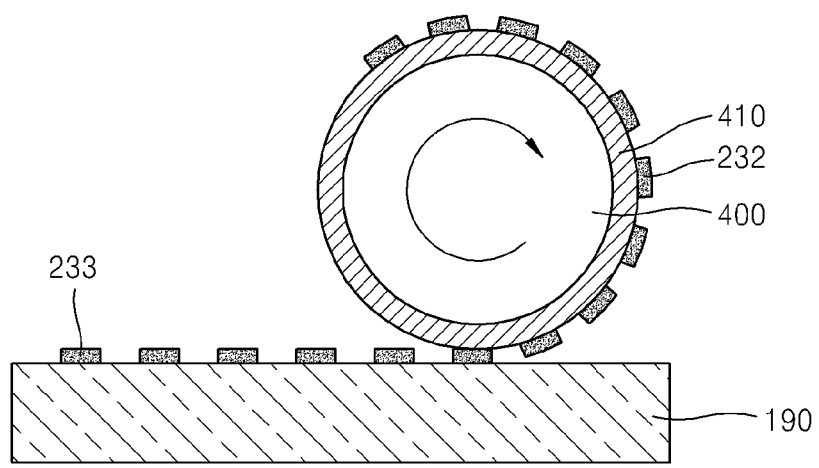

FIGS. 45 through 47 are conceptual views to explain a plate-to-plate offset printing process.

Referring to FIG. 45, grooves 511 of a first plate 510 may be filled with a liquid material 231 by a supplier 200. For example, the liquid material 231 may be a liquid epoxy material. A liquid material coated on the other portions of the first plate 510 over the grooves 511 can be removed using a blade 201.

Referring to FIG. 46, the blanket roll 400 is brought into contact with a first plate 510 while rotating. A circumference of the blanket roll 400 is encompassed by a blanket sheet 410. The blanket sheet 410 may include, for example, PDMS. When the liquid material 231 filling the grooves 511 of the first plate 510 contacts the blanket sheet 410, the liquid material 231 filling the grooves 511 of the first plate 510 attaches to the blanket sheet 410 due to a difference in the adhesive force of the liquid material 231 and the blanket sheet 410, thereby forming a first pattern 232.

Referring to FIG. 47, the blanket roll 400 rotates while in contact with a substrate 190. In this regard, the first pattern 232 on the blanket sheet 410 encompassing the circumference of the blanket roll 400 detaches from the blanket sheet 410 and attaches to the substrate 190, thereby forming a second pattern 233. The substrate 190 may be any one of the semiconductor substrate 10, the passivation layer pattern 30, the first polymer layer pattern 40, and the second polymer layer pattern 50 which have been described previously in connection with FIGS. 1 through 36. The second pattern 233 may be any one of the passivation layer pattern 30, the first polymer layer pattern 40, and the second polymer layer pattern 50, and the rerouting pattern 60 which have been described previously in connection with FIGS. 1 through 36.

The transfer mechanism from a blanket roll to a substrate may be understood with reference to FIGS. 37 through 39, and has already been described in connection with the gravure offset printing process, and thus, will not be further described herein.

Hereinbefore, a roll offset printing process has been described. Referring back to FIG. 13, the second polymer layer pattern 50 may have a Young's modulus of about 2 MPa through about 2 GPa. In one embodiment, for example, the second polymer layer pattern 50 may have a Young's modulus of about 10 MPa through about 900 MPa. More preferably, the Young's modulus of the second polymer layer pattern 50 may be in the range of about 10 MPa to about 200 MPa. The second polymer layer pattern 50 may be formed to expose at least a portion of the chip pad 21.

Figure 14:
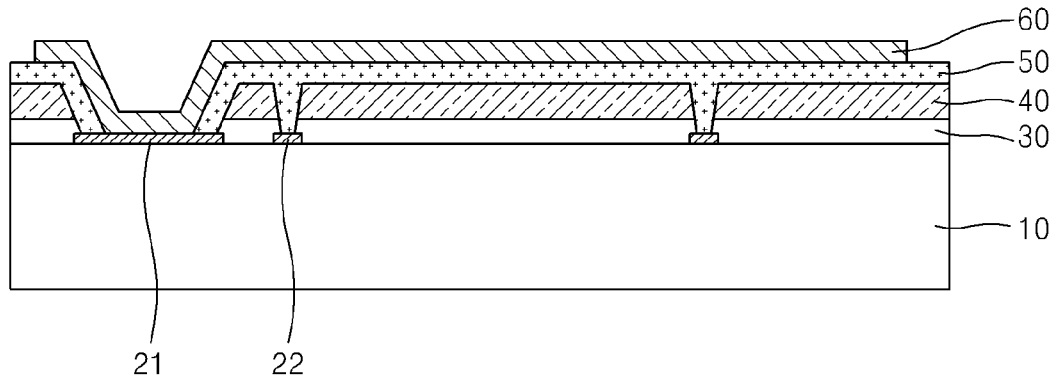

Referring to FIG. 14, a rerouting pattern 60 may be formed on the second polymer layer pattern 50. A portion of the rerouting pattern 60 may be electrically coupled to the chip pad 21.

Figure 15:
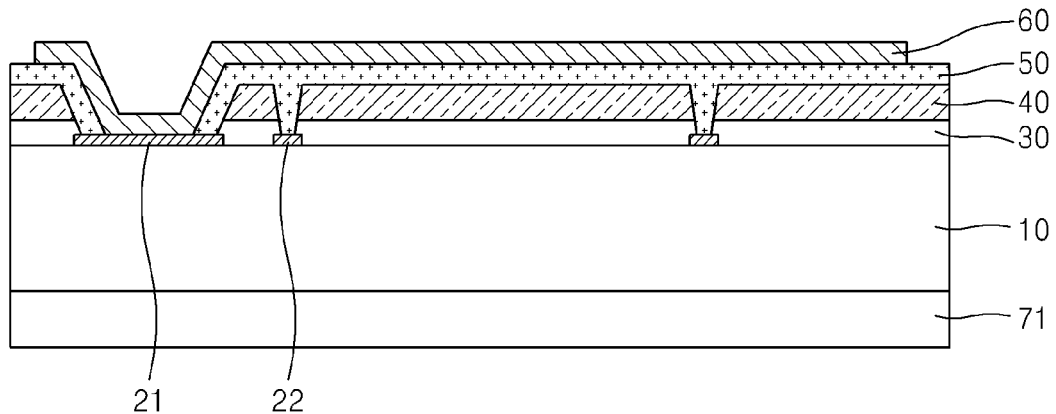

Referring to FIG. 15, a BSP layer 71 may be additionally formed on a lower surface of the semiconductor substrate 10. The BSP layer 71 may protect the semiconductor substrate 10 from surrounding environment, and in another embodiment, may be omitted.

Figure 16:
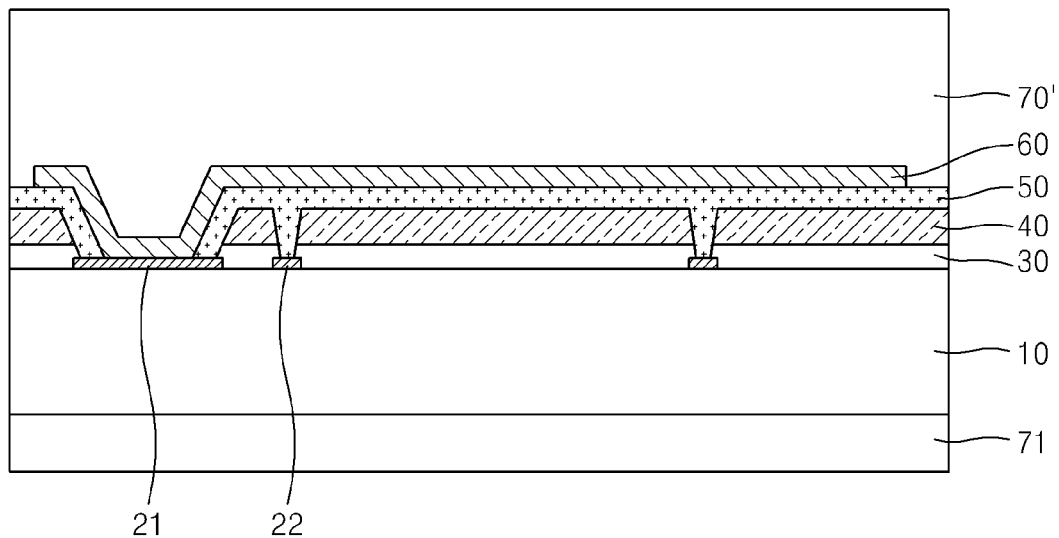

Referring to FIG. 16, a first encapsulant layer 70' that may directly contact the rerouting pattern 60 is formed. The first encapsulant layer 70' may include a material for sealing in a semiconductor package process, for example, rubber, an epoxy-based resin, a polymide-based resin polymer, or a fluoride-based resin polymer, which conventionally do not have water permeability. For example, the first encapsulant layer 70' may include a filler-containing material. The inclusion of the filler may lead to higher durability against external impacts. For example, the first encapsulant layer 70' may include a filler-containing EMC. Alternatively, the encapsulant layer 70' may include a filler-containing PDMS.

Referring to FIG. 17, a via hole C may be formed through the first encapsulant layer 70' to form a first encapsulant pattern 70. A portion of the first encapsulant layer 70' may be removed using a laser drill, for example, until the rerouting pattern 60 is exposed, thereby forming the via hole C. The via hole C may have a tapered shape having a wider upper portion and a narrower lower portion. For example, the via hole C narrows downward and may have a tapered shape having a circular cross-section. However, the via hole C may also have a different shape, such as a cylindrical shape, for example. If the first encapsulant layer 70' includes a filler-containing EMC and the filler is too large, the filler may not be appropriately removed by using the laser drill and may remain. Accordingly, the size of the filler may be 30 μm or less. The filler may have a generally spherical shape.

In some embodiments, the residue of the first encapsulant layer 70' may remain on the rerouting pattern 60 in the laser drill process. In this case, a separate cleaning process may be required to remove the residue. The cleaning process may include a wet chemical process and/or a dry etching process. The dry etching process may be performed using plasma. The cleaning process for removing the residue of the first encapsulant layer 70' may further include, in addition to a wet chemical process and/or a dry etching process, a supersonic cleaning process. The supersonic cleaning process may be an ultrasonic or megasonic process.

Figure 35:
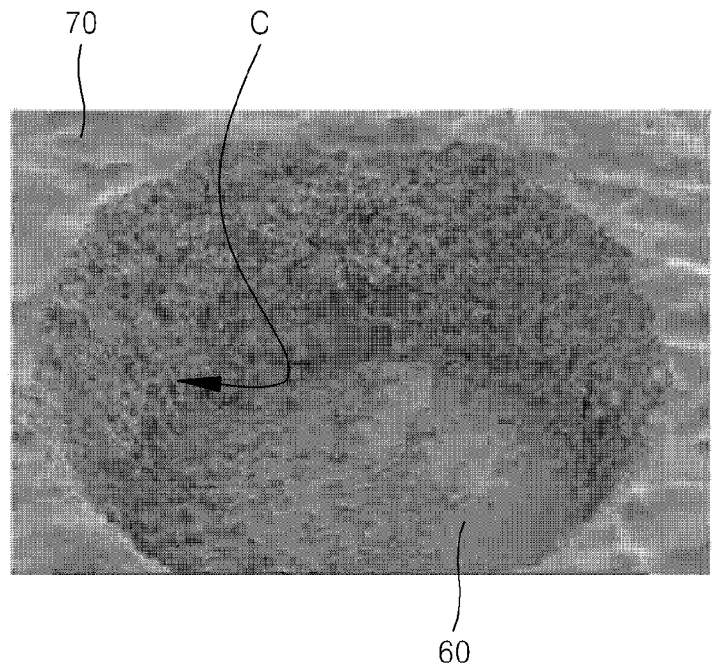
FIG. 35 shows an image of the residue of a first encapsulant layer before a cleaning process.
Figure 36:
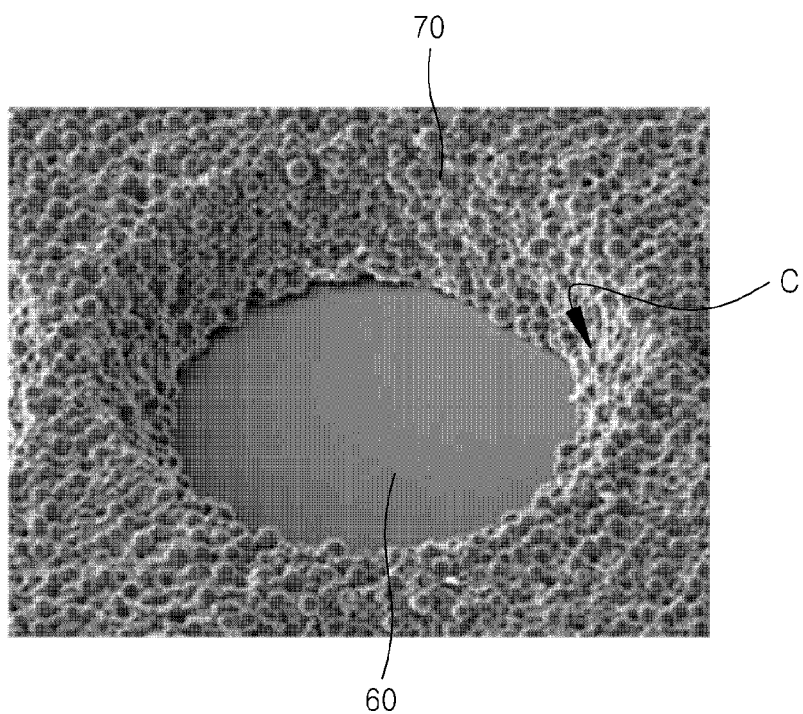
FIG. 36 shows an image of a first encapsulant layer when the residue of the first encapsulant layer is removed after a cleaning process.

FIG. 35 shows an image of the residue of the first encapsulant layer 70 before the cleaning process, and FIG. 36 shows an image of the first encapsulant layer 70 when the residue of the first encapsulant layer 70 is removed after a cleaning process.

Referring to FIGS. 35 and 36, the residue on the rerouting pattern 60 is completely removed by using the cleaning process. If the residue remains on the rerouting pattern 60, electrical characteristics of the rerouting pattern 60 may be deteriorated due to its non-conductivity. Accordingly, this problem may be easily overcome using the cleaning process.

Figure 18:
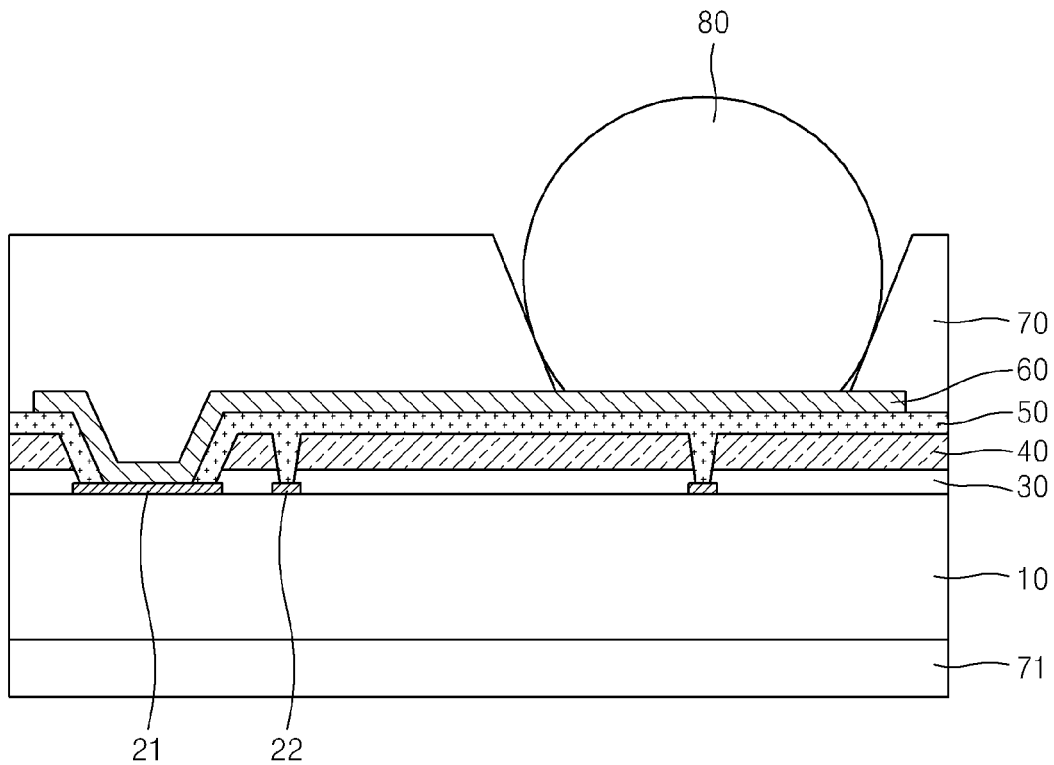

Referring to FIG. 18, an external connection terminal 80 is formed on a portion of the rerouting pattern 60 that is exposed through the via hole C. For example, the external connection terminal 80 may be a solder ball. The external connection terminal 80 may contact at least a portion of a sidewall of the via hole and may be separated from an upper portion of the sidewall of the via hole C by a gap G. That is, the external connection terminal 80 may be strongly fixed to the rerouting pattern 60 in such a way that the first encapsulant pattern 70 surrounds and directly contacts the external connection terminal 80 with the external connection terminal 80 being separated from an upper portion of a sidewall of the via hole C by the gap G. This structure may be readily provided where the via hole C is formed having a tapered shape that narrows downward and where the external connection terminal 80 is a solder ball. The external connection terminal 80 may be formed after the formation of the first encapsulant pattern 70. The gap G between the external connection terminal 80 and the upper portion of the sidewall of the via hole C may result from the external connection terminal 80, for example, a solder ball, being formed after the first encapsulant pattern 70 is formed. Because the first encapsulant pattern 70 may surround and directly contact the external connection terminal 80, the external connection terminal 80 may be strongly fixed to the rerouting pattern 60. However, if the external connection terminal 80 (for example, a solder ball) is formed and then the first encapsulant pattern 70 is formed, a solder may flow over a solder ball region in an attaching and reflowing process of a solder ball, thereby wetting the surrounding region. Accordingly, the first encapsulant pattern 70 may also define an external connection terminal region.

Figure 19:
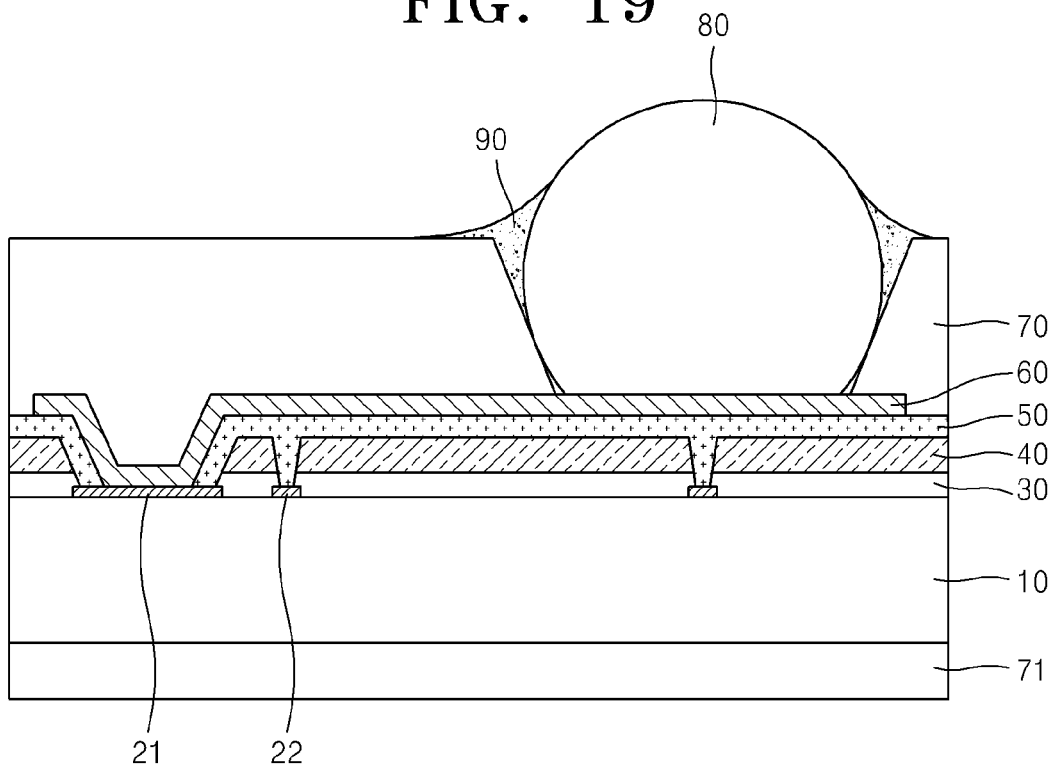

Referring to FIG. 19, a second encapsulant pattern 90 located along a boundary of the external connection terminal 80 by filling the gap G is formed. The second encapsulant pattern 90 may include a material through which water vapor more easily passes than a material of the first encapsulant pattern 70. For example, if the first encapsulant pattern 70 includes a filler-containing EMC, the second encapsulant pattern 90 may include PDMS.

Hereinafter, a method of forming the second encapsulant pattern 90 will be described in detail.

Figure 20:
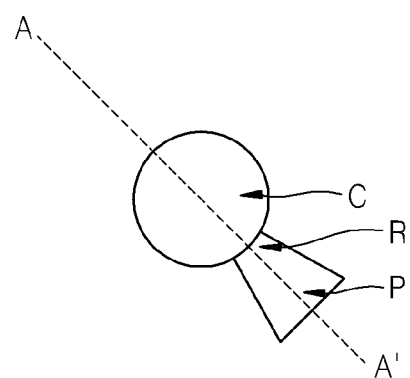
FIG. 20 is a top view of a first encapsulant pattern including a via hole and a pair including a runner, and a pocket which are used to form a second encapsulant pattern.
Figure 21:
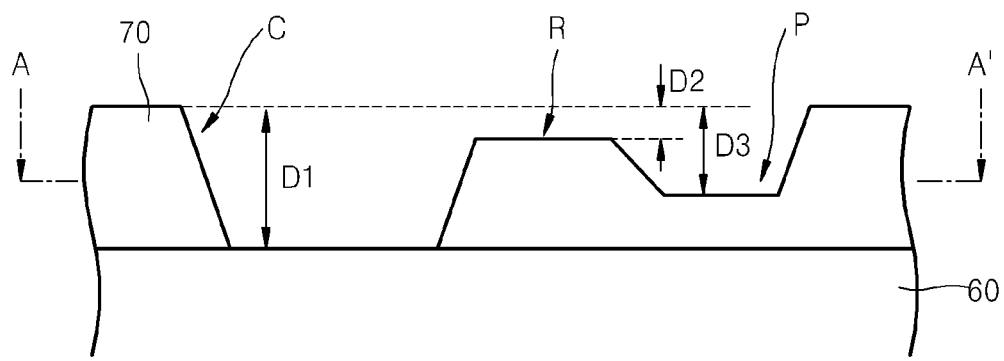
FIG. 21 is a cross-sectional view taken along a line A-A' of FIG. 20.

FIG. 20 is a top view of the first encapsulant pattern 70 including a via hole C, a runner R, and a pocket P which are used to form the second encapsulant pattern 90, and FIG. 21 is a cross-sectional view taken along a line A-A' of FIG. 20.

Referring to FIGS. 20 and 21, the first encapsulant pattern 70 may be formed to have a via hole C, a pocket P, and a runner R. The via hole C may have an external connection terminal region. The pocket P is formed in the vicinity of the via hole C and has a depth D3 that is smaller than a depth D1 of the via hole C. The runner R connects the via hole C to the pocket P and has a depth D2 that is smaller than the depth D3 of the pocket P. The runner R may have a smaller width in a direction from the pocket P to the via hole C.

Figure 22:
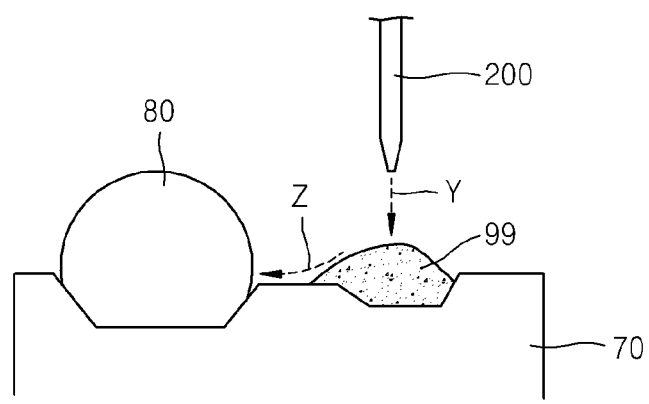
FIGS. 22 and 23 are cross-sectional views for sequentially explaining a method of forming a second encapsulant pattern.
Figure 23:
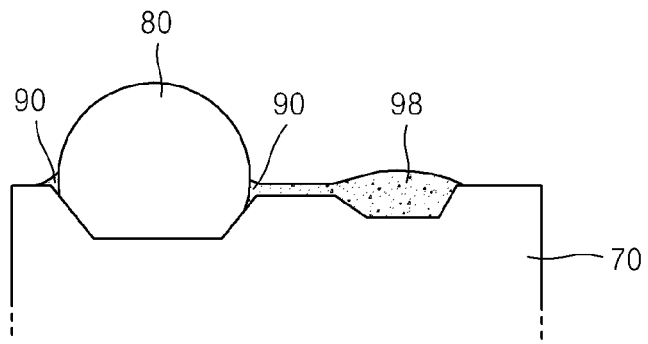

FIGS. 22 and 23 are cross-sectional views for explaining the method of forming the second encapsulant pattern 90.

Referring to FIG. 22, a second material for forming the second encapsulant pattern 90 may be dispensed in a liquid form to the pocket P. A liquid second material 99 is provided to the pocket P by a dispenser 200 in a Y direction. The liquid second material 99 in the pocket P fills the gap G in the via hole C through the runner R due to the capillary effect.

Referring to FIG. 23, a curing process is performed thereon to phase-change the liquid second material 99 into a solid form, thereby forming the second encapsulant pattern 90 along the boundary of the external connection terminal 80.

In some embodiments, although FIG. 20 illustrates a pair including the pocket P and the runner R in the vicinity of the via hole C formed in only one direction, pairs of the pocket P and the runner R in the vicinity of the via hole C may also be formed in various directions.

Figure 24:
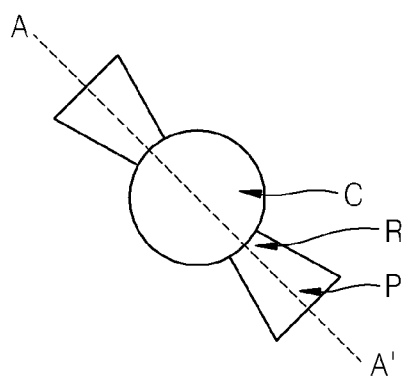
FIGS. 24 through 26 are top views of a first encapsulant pattern including a via hole and pairs including a pocket and a runner, where the pairs including a pocket and a runner are located around the via hole in various directions.
Figure 25:
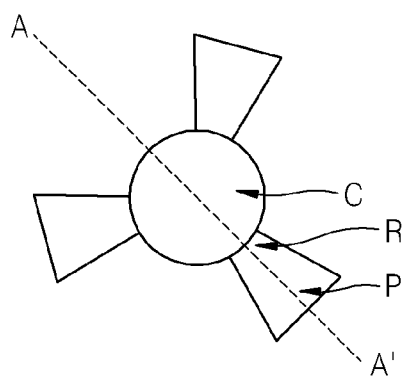
Figure 26:
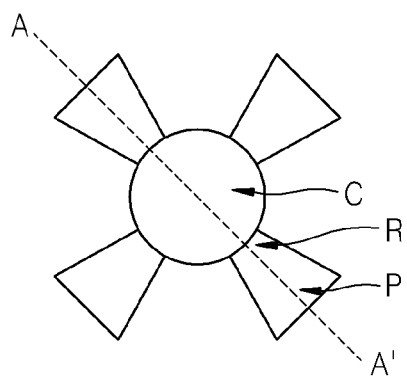
Figure 27:
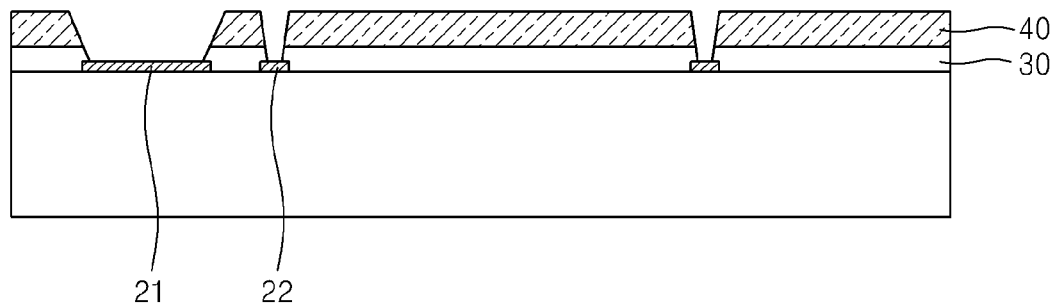
FIGS. 27 through 34 are cross-sectional views for sequentially explaining a method of fabricating a wafer level package, according to another embodiment of the inventive concept.
Figure 28:
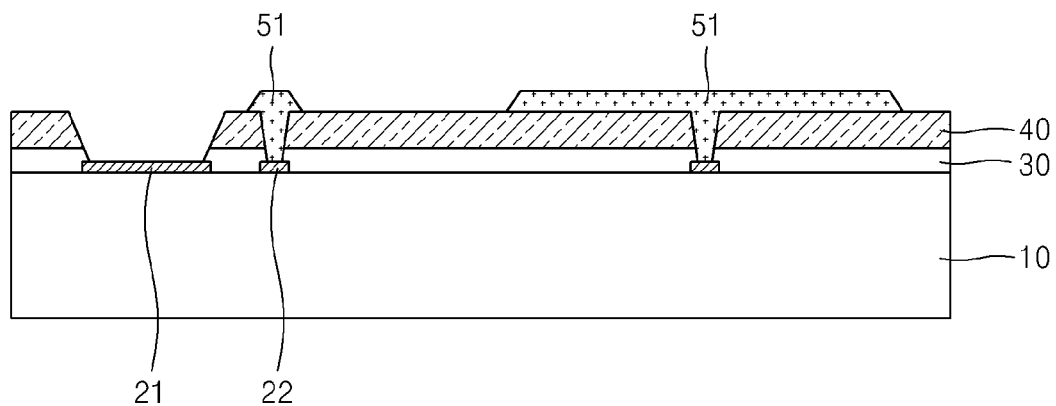
Figure 29:
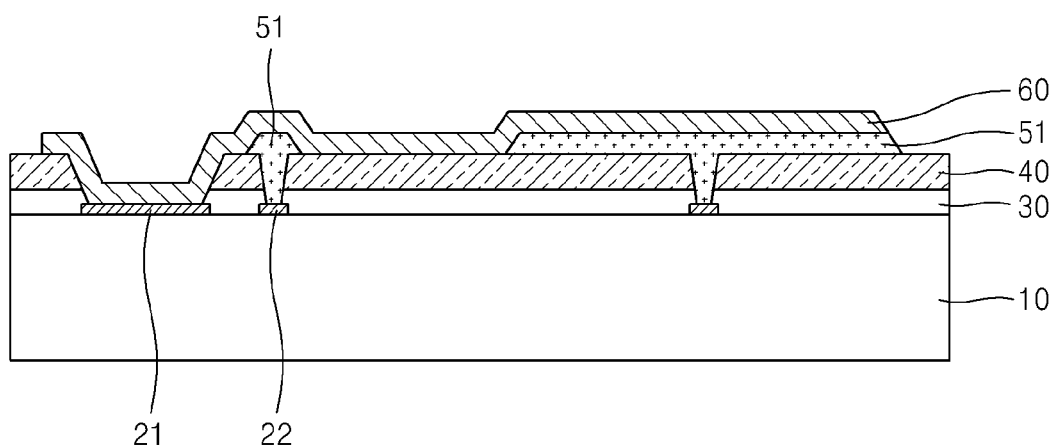
Figure 30:
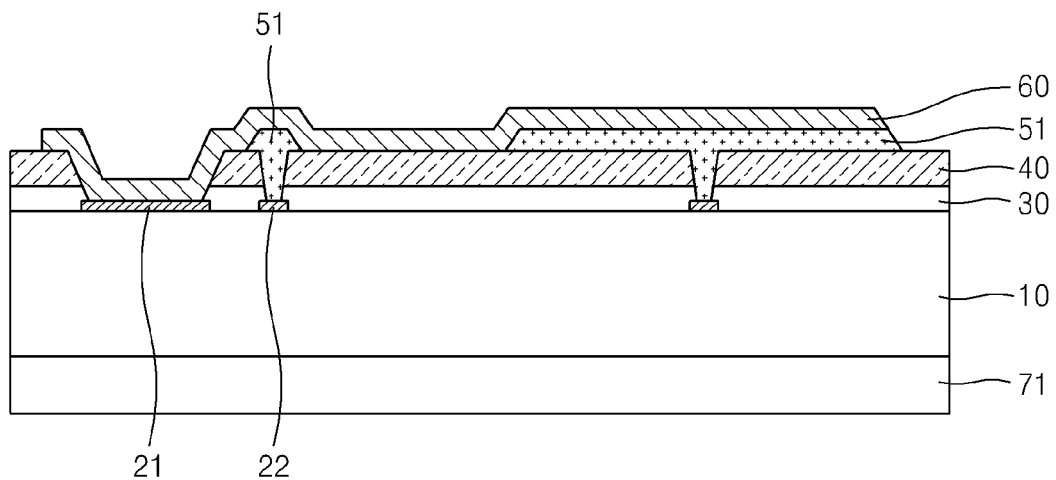
Figure 31:
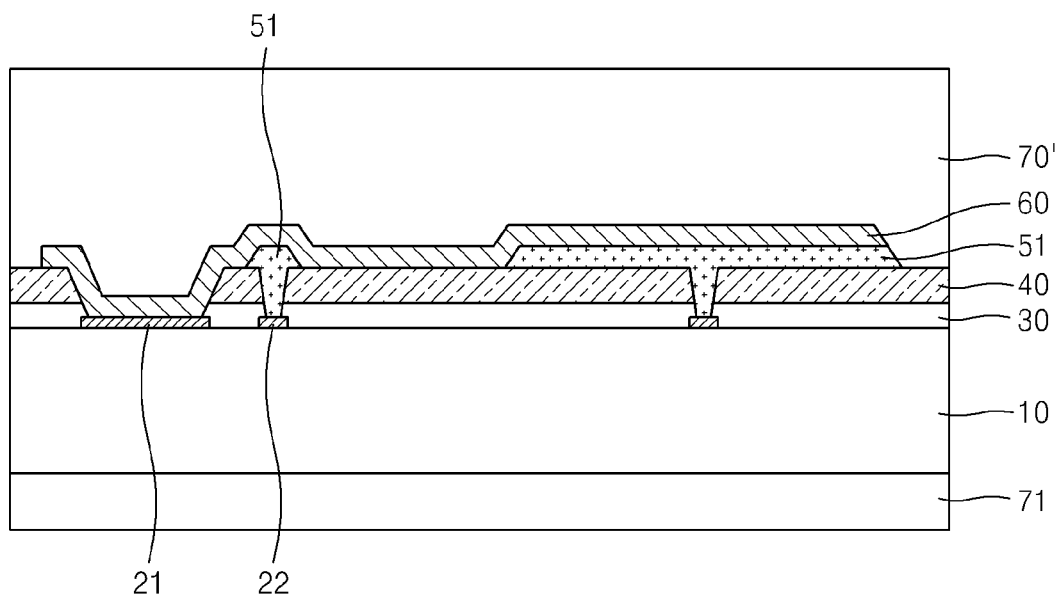
Figure 32:
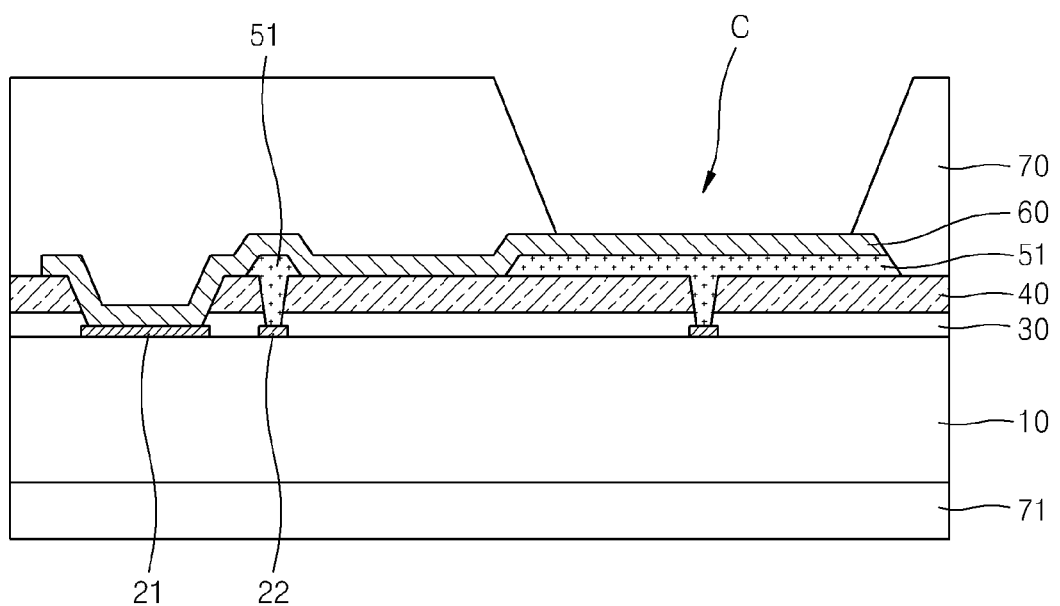
Figure 33:
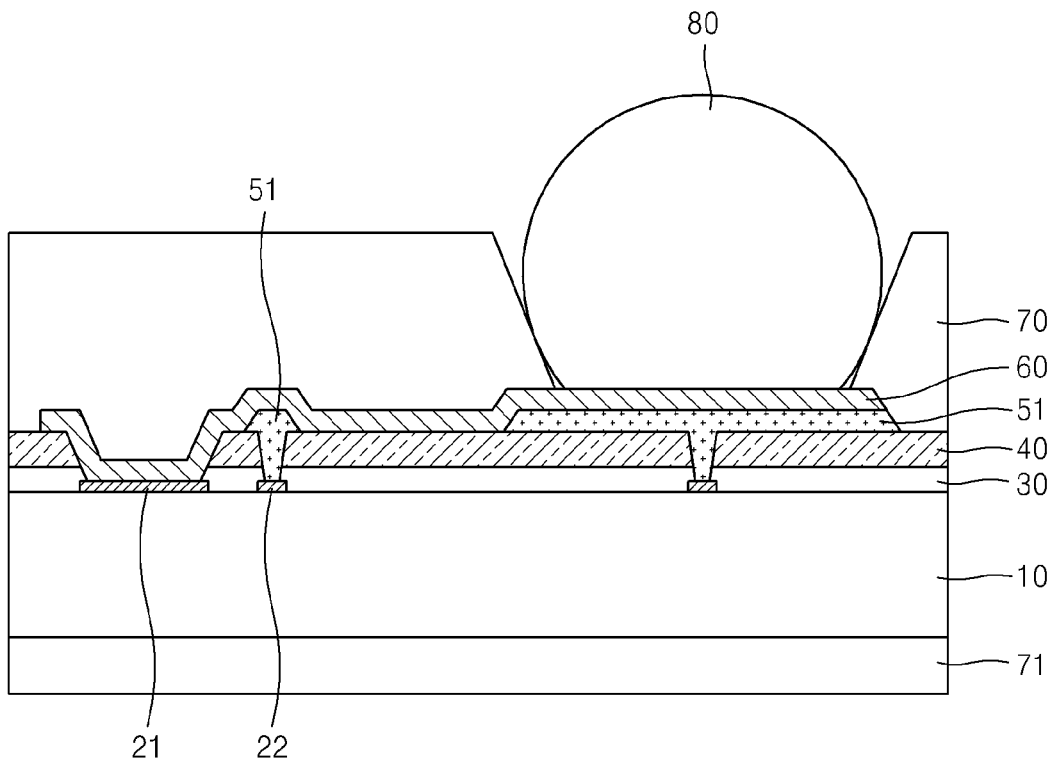
Figure 34:
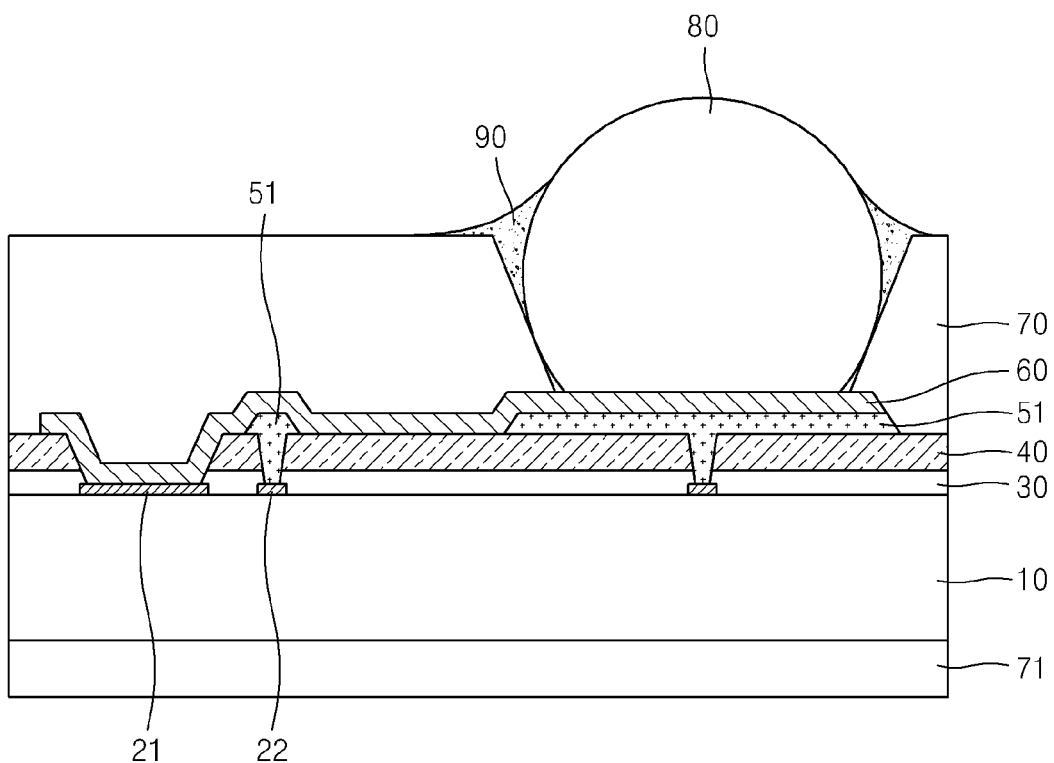

FIGS. 24 through 26 are top views of a first encapsulant pattern in which pairs, each consisting of the pocket P and the runner R in the vicinity of the via hole C, are formed in various directions.

Referring to FIG. 24, the pairs may be spaced apart from each other at an angle of 180° and may be provided in two directions.

Referring to FIG. 25, pairs of the pocket P and the runner R in the vicinity of the via hole C may be spaced apart from one another at an angle of 120° and provided in three directions.

Referring to FIG. 26, pairs of the pocket P and the runner R in the vicinity of the via hole C may be spaced apart from one another at an angle of 90° and provided in four directions.

Such providing of pocket P and runner R pairs in various directions in the vicinity of the via hole C may help effectively fill the gap G when the filling rate is low or the filling level is not appropriate when a liquid second material (see 99 of FIG. 22) on the pocket P flows through the runner R to fill the gap G in the via hole C due to the capillary effect.

Still Further Embodiment

FIGS. 27 through 34 are cross-sectional views for explaining a method of fabricating a wafer level package, according to another embodiment of the inventive concept. Like reference numerals in FIGS. 27 through 34 and FIGS. 12 through 19 denote like elements, and thus, like elements which have been described previously will not be further described herein.

Referring to FIGS. 27 through 34, a second polymer layer pattern 51 may be formed on a portion of the first polymer layer pattern 40. In addition, the second polymer layer pattern 51 may be formed to directly contact a portion of the fuse box 22 exposed through the passivation layer pattern 30 and the first polymer layer pattern 40.

As shown in FIGS. 12 through 19, the second polymer layer pattern 50 may alternatively be formed on substantially the entire surface of the first polymer layer pattern 40, and in this regard, adhesiveness-related problems may occur with respect to layers, and other process problems may also occur. In FIGS. 27 through 34, however, the second polymer layer pattern 51 is formed on the first polymer layer pattern 40 only in a fuse box region and an external connection terminal region. Accordingly, the adhesiveness-related problems described above may be reduced.

The second polymer layer pattern 51 may be formed by photolithography. However, since photolithography is an expensive process, the second polymer layer pattern 51 may also be formed by using a less expensive process such as a soft-lithography process described previously. The second polymer layer pattern 51 may be cured by using a subsequent heat treatment process.

A wafer level package according to the inventive concept allows patterns on a rerouting pattern to be easily formed while an external connection terminal is stably fixed.

In addition, in a wafer level package according to the inventive concept, separation of an external connection terminal due to water vapor pressure may be easily prevented.

Also, by using a method of fabricating a wafer level package according to the inventive concept, a wafer level package can be fabricated using a simplified process at low manufacturing costs while stably fixing an external connection terminal.

Another Embodiment

Figure 48:
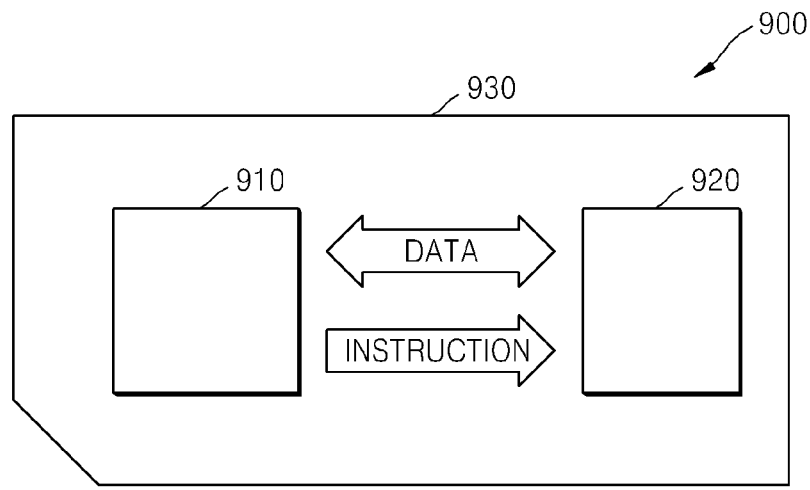
FIG. 48 is a block diagram of a memory card according to an embodiment of the inventive concept.

Referring to FIG. 48, the memory card 900 may include a controller 910 and a memory 920, which are housed in a housing 930. The controller 910 and the memory 920 may exchange electric signals. For example, the memory 920 and the controller 910 may exchange data according to instructions of the controller 910. Therefore, the memory card 900 may store data in the memory 920 or output data to outside from the memory 920.

For example, the memory 920 and/or the controller 910 may be included in any of the semiconductor packages described previously. The memory card 900 may be used as a data storage medium for various portable devices. For example, the memory card 900 may be a multimedia card (MMC) or a secure digital card (SD).

If any of the semiconductor packages described previously is used as the memory 920, the thickness or the volume of the memory card 900 can be reduced.

Figure 49:
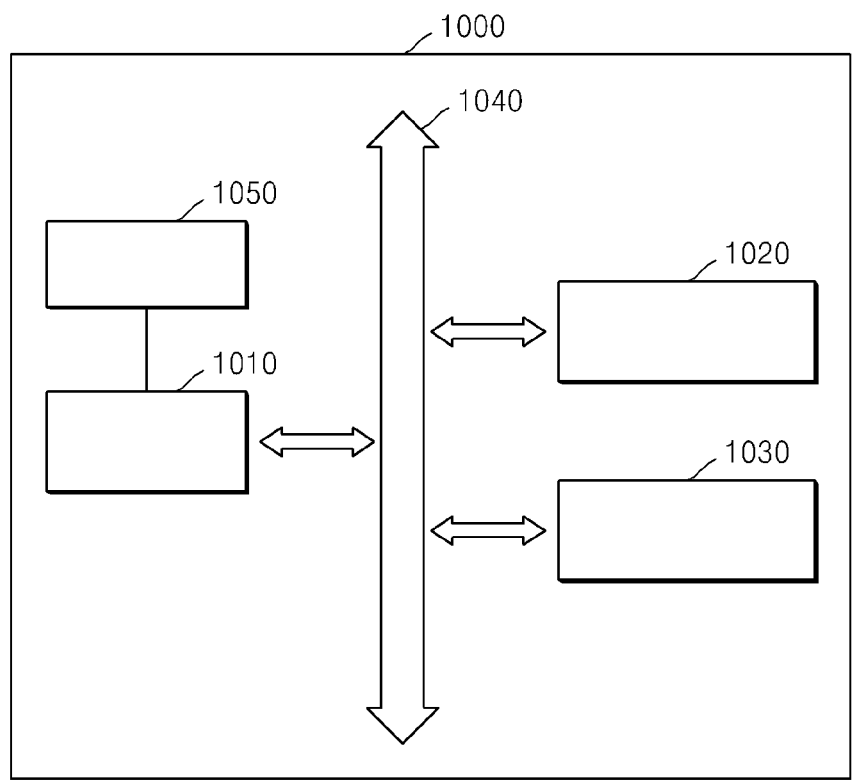
FIG. 49 is a block diagram of an electronic system according to an embodiment of the inventive concept.

FIG. 49 is a block diagram of an electronic system 1000 according to an embodiment of the inventive concept.

Referring to FIG. 49, the electronic system 1000 may include a processor 1010, an input/output device 1030, and a memory chip 1020, where the processor 1010, the input/output device 1030, and the memory chip 1020 may perform data communication with each other by using a bus 1040. The processor 1010 may execute a program and control the electronic system 1000. The input/output device 1030 may be used to input/output data to/from the electronic system 1000. The electronic system 1000 may be connected to an external device, e.g. a personal computer or a network, by using the input/output device 1030 and may exchange data with the external device. The memory chip 1020 may store codes or programs for operations of the processor 1010. For example, the memory chip 1020 and/or the processor 1010 may include any of the semiconductor packages described previously.

The electronic system 1000 may embody various electronic control systems requiring the memory 1020, and, for example, may be used in mobile phones, MP3 players, navigation devices, solid state disks (SSD), or household appliances.

Where any of the previously-described semiconductor devices are used as the memory chip 1020, the thickness or the volume of the electronic system 1000 can be reduced.

According to some embodiments, the processor 1010 may be of any type including but not limited to a microprocessor (µP), a microcontroller (µC), a digital signal processor (DSP), or any combination thereof. The processor 1010 may include a processor core (not illustrated) that can include a floating point unit (FPU), an arithmetic logic unit (ALU), and a digital signal processing core (DSP Core), or any combination thereof. The processor 1010 may also include registers (not illustrated). A memory controller 1050 can also be used with the processor 1010, or the memory controller 1010 can be an internal part of the processor 1010 depending on applications.

For example, the memory chip 1020, the memory controller 1050 and/or the processor 1010 may include any of the semiconductor packages described previously.

The system 1000 may also include an interface bus (not separately illustrated) for facilitating communication from various interface devices (e.g., output interfaces, peripheral interfaces, and communication interfaces) to the system 1000. The output interfaces may be configured to communicate with various external devices such as a display or speakers. The peripheral interfaces may be configured to communicate with external devices or other peripheral devices such as printers, fax machines, scanners and so on.

According to some embodiments, a system may include a wafer level package including a rerouting pattern formed on a semiconductor substrate, a first encapsulant pattern overlying the rerouting pattern, the first encapsulant pattern having a via hole to expose a portion of the rerouting pattern, and an external connection terminal formed on the exposed portion of the rerouting pattern. The via hole may have a sidewall. The upper section of the sidewall and a sidewall of the external connection terminal may be separated by a gap distance, which may increase toward an upper surface of the encapsulant pattern The system additionally includes an input/output device (e.g., keyboard, mouse, pen, voice input device, touch input device and so on) connected to the package.

The system 1000 may be implemented as a portion of a portable (or mobile) electronic device such as a personal media player device, a wireless web-watch device, a personal headset device, or a hybrid device that includes any of the above functions. In addition, the system 1000 may be implemented as part of a wireless base station or other wireless system or device.

Embodiments of the present application may also be applied to form application specific integrated circuits (ASICs), Programmable logic devices (PLDs)/Gate Arrays, digital signal processors (DSPs), Graphics and PC chipsets. Also, embodiments of the present application can be used to form a storage device for notebook PCs and sub-notebooks for enterprises, Ultra-Mobile PCs (UMPC), and Tablet PCs.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Various operations will be described as multiple discrete steps performed in a manner that is most helpful in understanding the invention. However, the order in which the steps are described does not imply that the operations are order-dependent or that the order that steps are performed must be the order in which the steps are presented.

While the inventive concept has been particularly shown and described with reference to exemplary embodiments thereof, it will be understood that various changes in form and details may be made therein without departing from the spirit and scope of the following claims.

What is claimed is:

1. A wafer level package comprising:
a rerouting pattern formed on a semiconductor substrate;
a first encapsulant pattern overlying the rerouting pattern, the first encapsulant pattern having a via hole to expose a portion of the rerouting pattern; and
an external connection terminal formed on the exposed portion of the rerouting pattern,
wherein the via hole has a sidewall, an upper section of the sidewall and a sidewall of the external connection terminal separated by a gap distance, the gap distance increasing toward an upper surface of the encapsulant pattern; and
wherein the wafer level package further comprises:
a chip pad and a fuse box which are formed on the semiconductor substrate; and
a passivation layer pattern, a first polymer layer pattern, and a second polymer layer pattern which are sequentially formed between the semiconductor substrate and the rerouting pattern,
wherein the chip pad is exposed through the passivation layer pattern, the first polymer layer pattern, and the second polymer layer pattern and contacts the rerouting pattern, and
the fuse box is exposed through the passivation layer pattern and the first polymer layer pattern and directly contacts the second polymer layer pattern.

2. The package of claim 1, wherein a sidewall of the via hole has a stepped cross-section, such that the upper section of the sidewall has a larger diameter than a lower section.

3. The package of claim 1, wherein the external connection terminal is substantially circular in cross-section, with a diameter that decreases adjacent the upper section of the sidewall.

4. A wafer level package comprising:
a rerouting pattern formed on a semiconductor substrate;
a first encapsulant pattern, directly contacting the rerouting pattern, the first encapsulant pattern having a via hole to expose a portion of the rerouting pattern; and
an external connection terminal formed on the exposed portion of the rerouting pattern, wherein a top edge portion of the first encapsulant pattern is spaced apart from the external connection terminal to define a gap therebetween; and
wherein the wafer level package further comprises:
a chip pad and a fuse box which are formed on the semiconductor substrate; and
a passivation layer pattern, a first polymer layer pattern, and a second polymer layer pattern which are sequentially formed between the semiconductor substrate and the rerouting pattern,
wherein the chip pad is exposed through the passivation layer pattern, the first polymer layer pattern, and the second polymer layer pattern and contacts the rerouting pattern, and the fuse box is exposed through the passivation layer pattern and the first polymer layer pattern and directly contacts the second polymer layer pattern.

5. The package of claim 4, wherein the gap surrounds a boundary of the external connection terminal in plan view.

6. The package of claim 4, wherein the width of the gap is substantially uniform in plan view.

7. The package of claim 4, wherein the passivation layer overlays the semiconductor substrate and exposes a portion of the chip pad, wherein the rerouting pattern is directly formed on the passivation layer.

8. The package of claim 4, further comprising a second encapsulant pattern that fills the gap.

9. The package of claim 8, wherein the second encapsulant pattern is arranged at opposing portions of the boundary of the external connection terminal.

10. The package of claim 8, wherein the second encapsulant pattern has three or more portions which are disposed at different locations around the boundary of the external connection terminal.

11. The package of claim 8, wherein the second encapsulant pattern that fills the gap has an upper surface substantially planar with an upper surface of the first encapsulant pattern.

12. The package of claim 8, wherein the second encapsulant pattern that fills the gap protrudes from the upper surface of the first encapsulant pattern.

13. A wafer level package comprising:
a rerouting pattern formed on a semiconductor substrate;
a first encapsulant pattern contacting the rerouting pattern, the first encapsulant pattern having a via hole to expose a portion of the rerouting pattern; and an external connection terminal formed on the exposed portion of the rerouting pattern the first encapsulant pattern comprises a material that contains at least one filler, wherein a top edge portion of the first encapsulant pattern is spaced apart from the external connection terminal to define a gap therebetween; and wherein the wafer level package further comprises:

a chip pad and a fuse box which are formed on the semiconductor substrate; and a passivation layer pattern, a first polymer layer pattern, and a second polymer layer pattern which are sequentially formed between the semiconductor substrate and the rerouting pattern, wherein the chip pad is exposed through the passivation layer pattern, the first polymer layer pattern, and the second polymer layer pattern and contacts the rerouting pattern, and the fuse box is exposed through the passivation layer pattern and the first polymer layer pattern and directly contacts the second polymer layer pattern.

14. The wafer level package of claim 13, wherein the at least one filler has a generally spherical shape.

15. The wafer level package of claim 13, wherein the size of the filler is about 30 µm or less.

16. The wafer level package of claim 13, wherein the first encapsulant pattern comprises a filler-containing epoxy mold compound (EMC).

17. The wafer level package of claim 13, wherein the first encapsulant pattern comprises a filler-containing silicone.

18. The wafer level package of claim 17, wherein the filler-containing silicone is polydimethylsiloxane (PDMS).

19. The wafer level package of claim 13, wherein the via hole has a tapered-shape having a wider upper portion and a narrower lower portion.

20. The wafer level package of claim 13, wherein the via hole has a tapered-shape that narrows downward and has a circular cross-section in plan view.

21. The wafer level package of claim 13, wherein the first polymer layer pattern comprises a material that has a greater Young's modulus than a material of the second polymer layer pattern.

22. The wafer level package of claim 21, wherein the second polymer layer pattern comprises a material that has a Young's modulus of an about 2 MPa to about 2 GPa.

23. The wafer level package of claim 13, wherein the second polymer layer pattern comprises a polydimethylsiloxane (PDMS) or an epoxy resin.

24. The wafer level package of claim 13, further comprising a second encapsulant pattern that is located along a boundary of the external connection terminal within the gap.

25. The wafer level package of claim 24, wherein the second encapsulant pattern comprises a material that has greater water permeability than a material of the first encapsulant pattern.

26. The wafer level package of claim 24, wherein the second encapsulant pattern comprises a polydimethylsiloxane (PDMS)-containing material.

27. The wafer level package of claim 13, wherein the second polymer layer pattern on the first polymer layer pattern is formed only in a fuse box region and an external connection terminal region.

* * * * *